(12) United States Patent
Egashira

(10) Patent No.: US 12,140,878 B2
(45) Date of Patent: Nov. 12, 2024

(54) PROCESSING SYSTEM, PROCESSING METHOD, MEASUREMENT APPARATUS, SUBSTRATE PROCESSING APPARATUS AND ARTICLE MANUFACTURING METHOD

(71) Applicant: CANON KABUSHIKI KAISHA, Tokyo (JP)

(72) Inventor: Shinichi Egashira, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/213,294

(22) Filed: Jun. 23, 2023

(65) Prior Publication Data
US 2023/0359134 A1   Nov. 9, 2023

Related U.S. Application Data

(63) Continuation of application No. 17/713,341, filed on Apr. 5, 2022, now Pat. No. 11,726,412.

(30) Foreign Application Priority Data

Apr. 21, 2021   (JP) .................................. 2021-072074

(51) Int. Cl.
| G03F 9/00 | (2006.01) |
| G06T 7/70 | (2017.01) |
| H01L 21/68 | (2006.01) |
| G03F 1/42 | (2012.01) |
| G03F 1/70 | (2012.01) |

(52) U.S. Cl.
CPC .......... *G03F 9/7046* (2013.01); *G03F 9/7076* (2013.01); *G03F 9/7088* (2013.01);
(Continued)

(58) Field of Classification Search
CPC .......... G03F 1/42; G03F 1/70; G03F 7/70775; G03F 7/7085; G03F 7/70633;
(Continued)

(56) References Cited

U.S. PATENT DOCUMENTS

| 6,331,709 B1 | 12/2001 | Amemiya |
| 11,726,412 B2 * | 8/2023 | Egashira ............... H01L 21/682 355/77 |

(Continued)

FOREIGN PATENT DOCUMENTS

| DE | 10335816 A1 | 3/2005 |
| JP | 6719729 B | 7/2020 |

(Continued)

OTHER PUBLICATIONS

Invitation to Respond to Written Opinion issued by the Intellectual Property Office of Singapore on Nov. 24, 2023 in corresponding SG Patent Application No. 10202203853U.

(Continued)

*Primary Examiner* — Peter B Kim
(74) *Attorney, Agent, or Firm* — Carter, DeLuca & Farrell LLP

(57) ABSTRACT

The present invention provides a processing system that includes a first apparatus and a second apparatus, and processes a substrate, wherein the first apparatus includes a first measurement unit configured to detect a first structure and a second structure different from the first structure provided on the substrate, and measure a relative position between the first structure and the second structure, and the second apparatus includes an obtainment unit configured to obtain the relative position measured by the first measurement unit, a second measurement unit configured to detect the second structure and measure a position of the second structure, and a control unit configured to obtain a position of the first structure based on the relative position obtained by the obtainment unit and the position of the second structure measured by the second measurement unit.

4 Claims, 18 Drawing Sheets

(52) U.S. Cl.
CPC .............. *G03F 9/7092* (2013.01); *G06T 7/70* (2017.01); *H01L 21/681* (2013.01); *H01L 21/682* (2013.01); *G03F 1/42* (2013.01); *G03F 1/70* (2013.01); *G06T 2207/30108* (2013.01)

(58) Field of Classification Search
CPC .... G03F 9/7046; G03F 9/7076; G03F 9/7084; G03F 9/7088; G03F 9/7092; G03F 9/7093; G06T 2207/30108; G06T 7/70; H01L 21/681; H01L 21/682
See application file for complete search history.

(56) References Cited

U.S. PATENT DOCUMENTS

| | | |
|---|---|---|
| 2001/0028457 A1 | 10/2001 | Matsuura |
| 2004/0027573 A1 | 2/2004 | Takahashi |
| 2004/0189995 A1 | 9/2004 | Tanaka |
| 2009/0244513 A1 | 10/2009 | Matsumoto |
| 2010/0171942 A1 | 7/2010 | Liu |
| 2013/0321811 A1* | 12/2013 | Maeda ................ G03F 9/7084 356/400 |
| 2020/0266087 A1 | 8/2020 | Ichinose |

FOREIGN PATENT DOCUMENTS

| | | |
|---|---|---|
| WO | 2015/152106 A1 | 10/2015 |
| WO | 2016/136691 A1 | 9/2016 |

OTHER PUBLICATIONS

Extended European Search Report dated Sep. 15, 2022 issued in corresponding EP Application No. 22166450.1.

* cited by examiner

PROCESSING SYSTEM, PROCESSING METHOD, MEASUREMENT APPARATUS, SUBSTRATE PROCESSING APPARATUS AND ARTICLE MANUFACTURING METHOD

CROSS REFERENCE TO RELATED APPLICATIONS

This application is a continuation of U.S. patent application Ser. No. 17/713,341, filed on Apr. 5, 2022, which claims the benefit of and priority to Japanese Patent Application No. 2021-072074, filed Apr. 21, 2021, each of which is hereby incorporated by reference herein in their entirety.

BACKGROUND OF THE INVENTION

Field of the Invention

The present invention relates to a processing system, a processing method, a measurement apparatus, a substrate processing apparatus and an article manufacturing method.

Description of the Related Art

In recent years, along with micropatterning and higher integration of devices, a demand for improving the device alignment accuracy is growing. To cope with this, Japanese Patent No. 6719729 proposes a technique in which, in order to implement the alignment with high accuracy even if a distortion of a substrate (substrate distortion) has occurred in the device manufacturing process, the positions of a large number of alignment marks on the substrate are measured and the substrate distortion is corrected with high accuracy. Substrate distortions that can be corrected by the above-described technique include, in addition the shape of the array of a plurality of section regions (regions to be exposed, which is so-called shot regions) in the entire substrate, the shape of each section region. For example, in the technique disclosed in patent literature 1, correction of the shape of the array of a plurality of section regions on a substrate and correction of the shape of each section region are performed using information regarding the substrate distortion obtained in advance.

In order to perform the correction of the shape of the section region on the substrate, it is necessary to detect a plurality of alignment marks in the section region. However, usually, a plurality of alignment marks are rarely provided in the section region. Therefore, a method is conceivable in which, by alternatively using a plurality of overlay inspection marks provided in a section region on a substrate, measurement for correcting the shape of the section region is performed. However, since the shape of the overlay inspection mark is special, a detection optical system dedicated to the overlay inspection mark is required.

Another problem related to the correction of the shape of a section region on a substrate is an increase of the number of processes which makes it difficult to detect the alignment mark. For example, as the devices are stacked, the number of steps using hard masks is increasing. Although the hard mask can increase the etching resistance by increasing the carbon (C) content, when detecting the alignment mark via the hard mask, the transmittance of light (illumination light) which illuminates the alignment mark is decreased. To prevent this, a method is conceivable which uses an alignment detection optical system that increases the selectivity of the wavelength of illumination light to enable detection of the alignment mark with high accuracy. However, even with this method, the dedicated alignment detection optical system is required.

As has been described above, in order to correct the shape of a section region on a substrate, the dedicated detection optical system is required. However, from the viewpoint of arrangement constraints, it is not practical to mount such the dedicated detection optical system on an exposure apparatus. Further, even if the dedicated detection optical system can be mounted on the exposure apparatus, this leads to an increase in cost.

SUMMARY OF THE INVENTION

The present invention provides a technique advantageous in alignment of a substrate.

According to one aspect of the present invention, there is provided a processing system that includes a first apparatus and a second apparatus, and processes a substrate, wherein the first apparatus includes a first measurement unit configured to detect a first structure and a second structure different from the first structure provided on the substrate, and measure a relative position between the first structure and the second structure, and the second apparatus includes an obtainment unit configured to obtain the relative position measured by the first measurement unit, a second measurement unit configured to detect the second structure and measure a position of the second structure, and a control unit configured to obtain a position of the first structure based on the relative position obtained by the obtainment unit and the position of the second structure measured by the second measurement unit.

Further aspects of the present invention will become apparent from the following description of exemplary embodiments with reference to the attached drawings.

DESCRIPTION OF THE EMBODIMENTS

Figure 1:
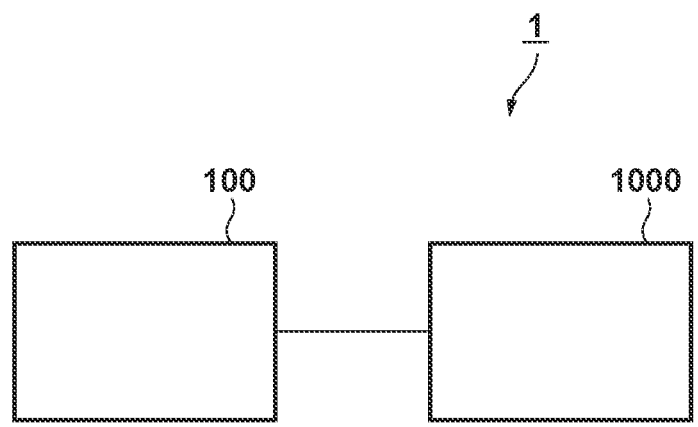
FIG. 1 is a schematic view illustrating configurations of a processing system according to an aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view illustrating configurations of a processing system 1 according to an aspect of the present invention. The processing system 1 includes a measurement apparatus 100 (first apparatus) and an exposure apparatus 1000 (second apparatus). In the processing system 1, the measurement apparatus 100 measures, in advance, the position of a structure provided on a substrate and transmits it to the exposure apparatus 1000, and the exposure apparatus processes the substrate using the position of the structure obtained from the measurement apparatus 100. In this embodiment, the measurement apparatus 100 measures the relative position between two marks serving as the structures provided on the substrate, and the exposure apparatus 1000 aligns the substrate to a target position and processes the substrate based on the relative position between the marks.

Thus, in the processing system 1, a high-accuracy detection optical system included in the measurement apparatus 100 is used to measure the relative position between the alignment mark provided in a target layer of the substrate and an alternative mark provided in a layer different from the target layer. With this, the exposure apparatus 1000 can perform alignment of the target layer without measuring the position of the alignment mark provided in the target layer of the substrate.

Note that the exposure apparatus 1000 forming the processing system 1 can be replaced with a substrate processing apparatus in which it is required to align a substrate serving as an object to a target position and process the substrate. Such a substrate processing apparatus includes, for example, an imprint apparatus, a drawing apparatus, or the like. Here, the imprint apparatus brings an imprint material arranged on a substrate into contact with a mold and applies curing energy to the imprint material, thereby forming a pattern of a cured product to which a pattern of the mold has been transferred. The drawing apparatus forms a pattern (latent image pattern) on a substrate by drawing on the substrate with a charged particle beam (electron beam) or a laser beam.

Figure 2:
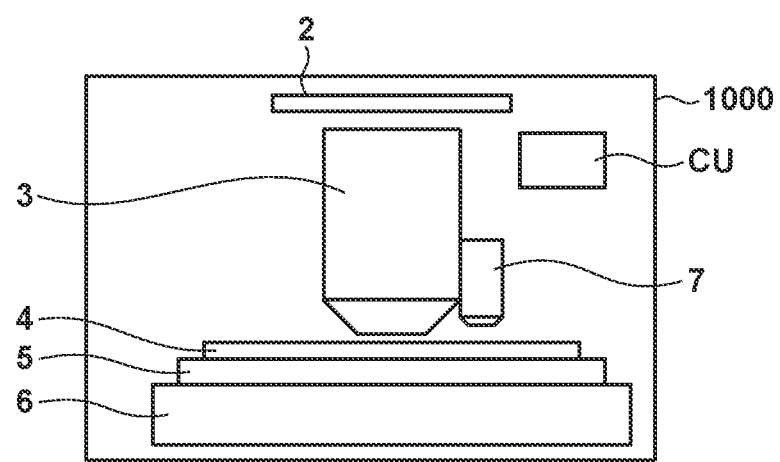
FIG. 2 is a schematic view illustrating configurations of an exposure apparatus.

First, with reference to FIG. 2, configurations of the exposure apparatus 1000 will be described. FIG. 2 is a schematic view illustrating configurations of the exposure apparatus 1000. The exposure apparatus 1000 is a substrate processing apparatus that processes a substrate 4 to form a pattern on the substrate 4. In this embodiment, the exposure apparatus 1000 projects the pattern of an original 2 (reticle or mask) onto the substrate 4 via a projection optical system 3 and exposes the substrate 4.

The exposure apparatus 1000 includes the projection optical system 3 that projects (reduction-projects) a pattern formed on the original 2, and a substrate chuck 5 that holds the substrate 4 on which a underlayer pattern and an alignment mark have been formed in a preceding step. The exposure apparatus 1000 also includes a substrate stage 6 for holding the substrate chuck 5 and positioning the substrate 4 at a predetermined position (target position), a detection optical system 7 that measures the position of a structure represented by an alignment mark provided on the substrate 4, and a control unit CU.

The control unit CU is formed by, for example, a computer (information processing apparatus) that includes a CPU, a memory, and the like, and comprehensively controls the respective units of the exposure apparatus 1000 in accordance with programs stored in the storage unit and the like. As will be described later in detail, the control unit CU implements the following functions in this embodiment. The control unit CU obtains a measurement result of the measurement apparatus 100 (a detection optical system 107), more specifically, the relative position between the first structure provided on the substrate 4 and the second structure different from the first structure (functions as an obtainment unit). Further, the control unit CU performs control for aligning the substrate 4 to a target position and processing the substrate 4 based on the relative position between the first structure and the second structure obtained from the measurement apparatus 100 and a measurement result of the detection optical system 7, more specifically, the position of the second structure. Note that processing of the substrate 4 is an exposure process of exposing the substrate 4 via the original 2 to transfer the pattern of the original 2 to the substrate 4.

Figure 3:
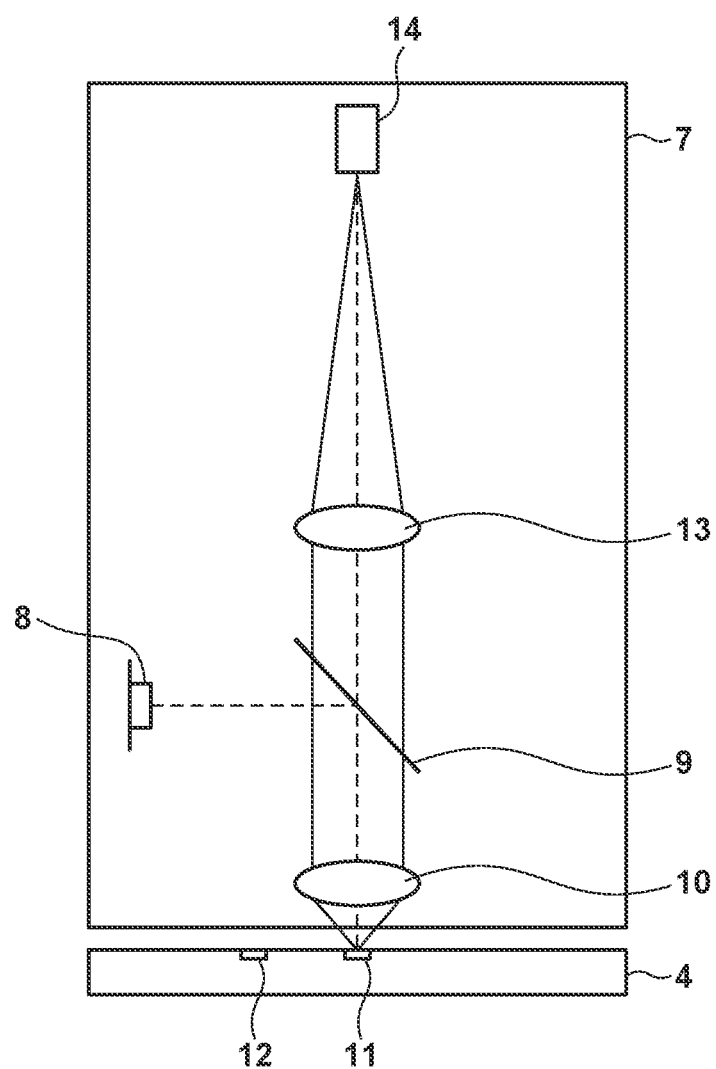
FIG. 3 is a schematic view illustrating configurations of a detection optical system of the exposure apparatus illustrated in FIG. 2.

FIG. 3 is a schematic view illustrating configurations of the detection optical system 7. Light from a light source 8 is reflected by a beam splitter 9 and illuminates, via a lens 10, an alignment mark 11 or 12 provided on the substrate 4. The light diffracted by the alignment mark 11 or 12 is detected (received) by a sensor 14 via the lens 10, the beam splitter 9, and a lens 13.

Figure 4:
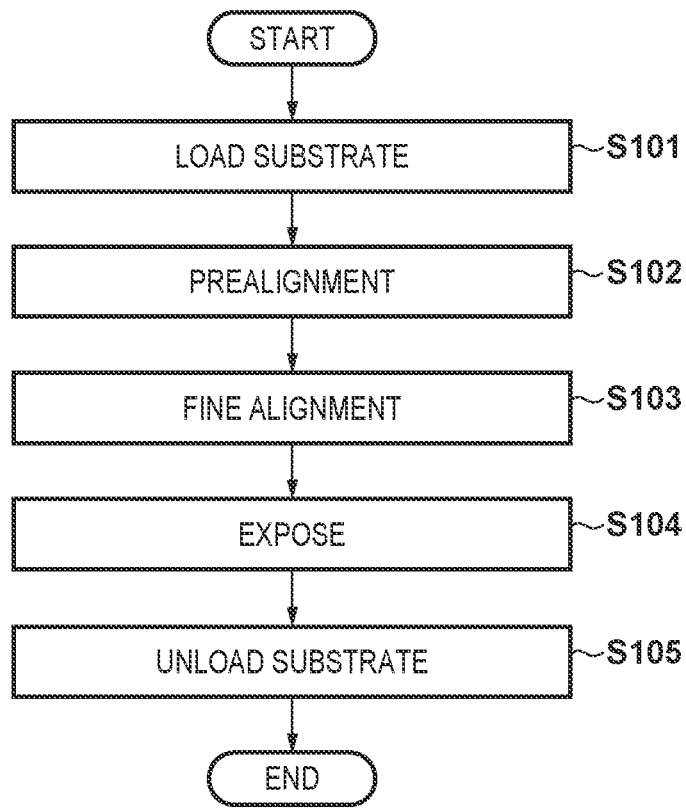
FIG. 4 is a flowchart for explaining a general exposure process.

With reference to FIG. 4, a general exposure process in the exposure apparatus 1000 will be described. The outline of processes until the substrate 4 is aligned and exposed will be described here. In step S101, the substrate 4 is loaded into the exposure apparatus 1000. In step S102, prealignment is performed. More specifically, the alignment mark 11 for prealignment provided on the substrate 4 is detected by the detection optical system 7 to obtain the position of the substrate 4 with low accuracy. At this time, detection of the alignment mark 11 is performed for a plurality of section regions (each of which is a region (shot region) serving as a unit of the region to be exposed) of the substrate 4, and the shift and first-order linear components (magnification and rotation) of the entire substrate 4 are obtained. In step S103, fine alignment is performed. More specifically, based on the result of the prealignment, the substrate stage 6 is driven to a position where the detection optical system 7 can detect the alignment mark 12 for fine alignment, and the detection optical system 7 detects the alignment mark 12 provided in each of the plurality of section regions of the substrate 4. Then, the shift and first-order linear components (magnification and rotation) of the entire substrate 4 are obtained accurately. In step S104, the substrate 4 is exposed. More specifically, after the fine alignment is performed, the pattern of the original 2 is transferred to each section region of the substrate 4 via the projection optical system 3. In step S105, the substrate 4 is unloaded from the exposure apparatus 1000.

Figure 5:
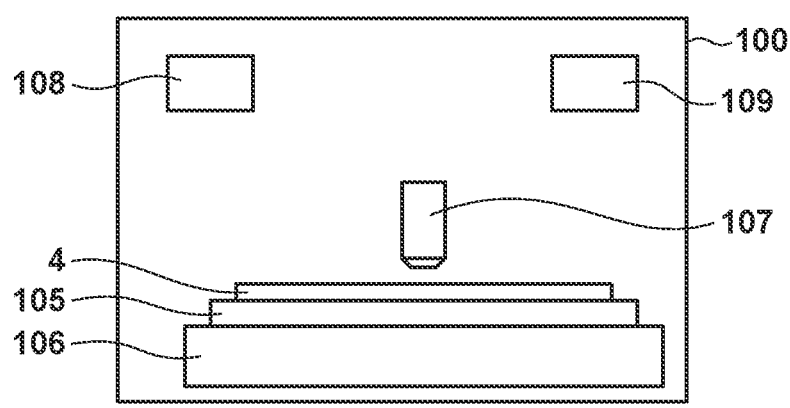
FIG. 5 is a schematic view illustrating configurations of a measurement apparatus.

Next, with reference to FIG. 5, configurations of the measurement apparatus 100 will be described. FIG. 5 is a schematic view illustrating configurations of the measurement apparatus 100. The measurement apparatus 100 is formed as an apparatus different from the exposure apparatus 1000 (that is, an apparatus outside the exposure apparatus 1000). The measurement apparatus 100 is a measurement apparatus that detects structures, for example, the first structure and the second structure different from the first structure, provided on the substrate 4 and measures the relative position between the first structure and the second structure.

The measurement apparatus 100 includes a substrate chuck 105 that holds the substrate 4, and a substrate stage 106 that holds the substrate chuck 105 and positions the substrate 4 at a predetermined position (target position). The measurement apparatus 100 also includes the detection optical system 107 that measures, with high accuracy, the position of the alignment mark provided on the substrate 4, a control unit 108, and an interface 109.

The detection optical system 107 basically has configurations similar to those of the detection optical system 7 of the exposure apparatus 1000. However, the detection optical system 107 is a detection optical system that implements the higher accuracy and the higher functionality than the detection optical system 7, and has configurations such as a high numerical aperture, a high magnification, and a multi-pixel sensor, which enable highly accurate measurement of the structure provided on the substrate 4 represented by the alignment mark. Further, in order to improve the visibility of the alignment mark, the detection optical system 107 has configurations that implement the high brightness and high selectivity of wavelength of the light (illumination light) which illuminates the alignment mark.

The control unit 108 is formed by, for example, a computer (information processing apparatus) that includes a CPU, a memory, and the like, and comprehensively controls the respective units of the measurement apparatus 100 in accordance with programs stored in the storage unit and the like. By controlling operations of the respective units of the measurement apparatus 100, the control unit 108 controls a measurement process including a process of measuring the position of the structure provided on the substrate 4 and a process of measuring the relative position between two structures provided on the substrate 4.

The interface 109 is a user interface that includes a display device, an input device, and the like, and transmits information and instructions from the measurement apparatus 100 to a user or from the user to the measurement apparatus 100. In the interface 109, when the user inputs necessary information via the input device while referring to a screen provided on the display device, the user can designate, among a plurality of structures provided on the substrate 4, the structure whose position is to be measured by the measurement apparatus 100. In this manner, in this embodiment, the interface 109 is provided for the user to designate the structure to be detected by the detection optical system 107.

The measurement process performed under the control of the control unit 108 in the measurement apparatus 100 will be described. More specifically, the measurement process will be described in which two alignment marks (the first structure and the second structure different from the first structure) provided on the substrate 4 are detected and the relative position between the two alignment marks is measured. The two alignment marks are designated by the user via the interface 109 as described above.

Figure 6:
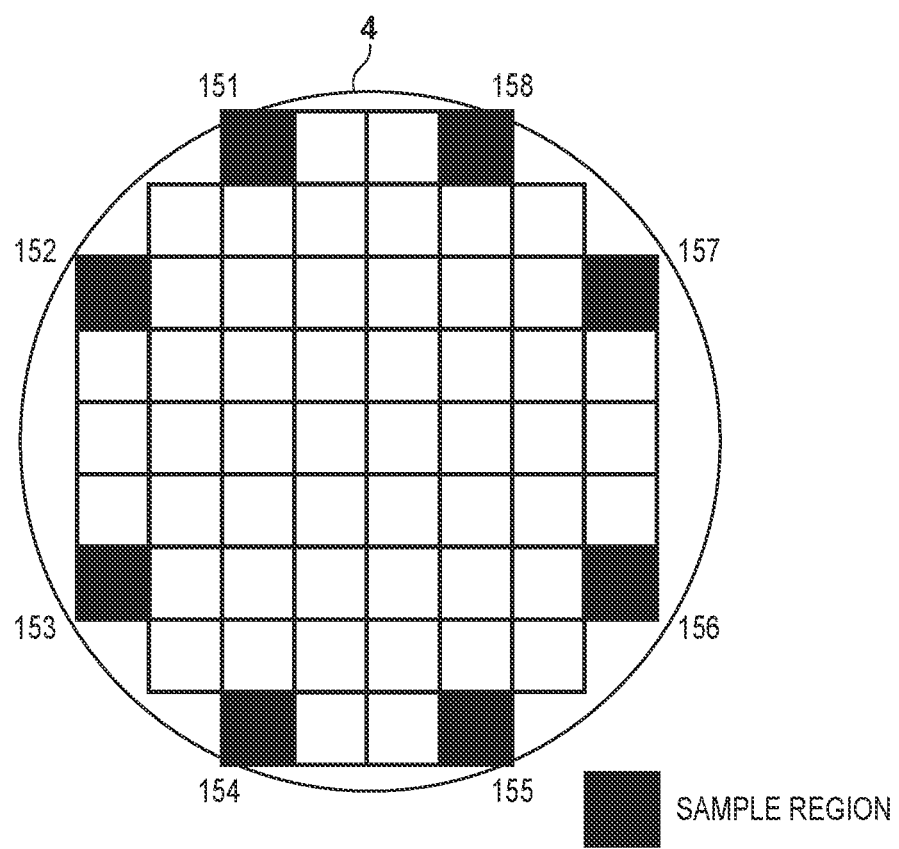
FIG. 6 is a view illustrating the array of a plurality of section regions of a substrate.
Figure 7:
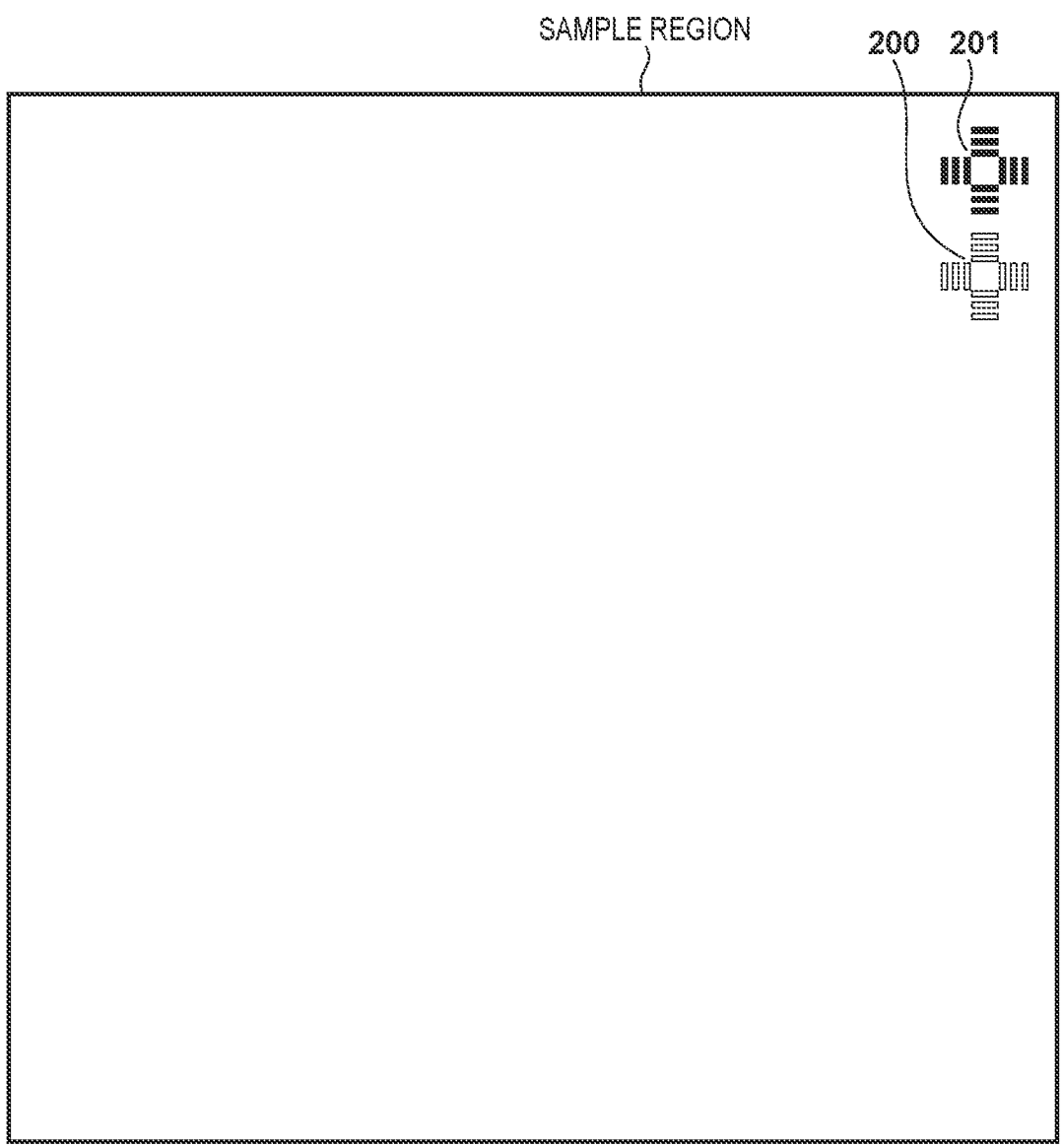
FIG. 7 is a view illustrating an example of alignment marks provided in a sample region.

First, the alignment mark, which serves as the measurement target of the measurement apparatus 100, provided on the substrate 4 will be described. FIG. 6 is a view illustrating an array of a plurality of section regions of the substrate 4. Among the plurality of section regions of the substrate 4, the section regions on which the measurement process (alignment measurement) is performed are referred to as sample regions 151 to 158. In each of the sample regions 151 to 158, a first alignment mark 200 (first structure) and a second alignment mark 201 (second structure) are provided as illustrated in FIG. 7. FIG. 7 is a view illustrating an example of the alignment marks provided in each of the sample regions 151 to 158. The first alignment mark 200 and the second alignment mark 201 are provided in different layers on the substrate 4. The first alignment mark 200 is an alignment mark provided in a target layer on the substrate 4, and the second alignment mark 201 is an alignment mark provided in a layer different from the target layer on the substrate 4. Usually, the first alignment mark 200 and the second alignment mark 201 are provided at positions spaced apart from each other since they are not used together in alignment. For example, letting L be the relative distance between the first alignment mark 200 and the second alignment mark 201 and S be the size of the second alignment mark 201, L/S>3 is satisfied. Note that the target layer is a process layer which is to be aligned upon forming a pattern on the substrate 4.

Figure 8:
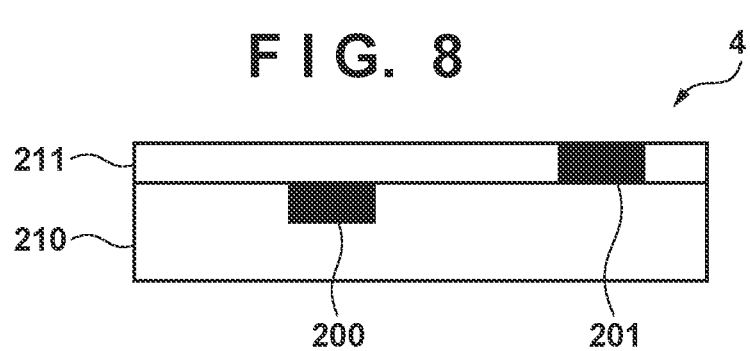
FIG. 8 is a view illustrating a section of the substrate provided with a first alignment mark and a second alignment mark.

FIG. 8 is a view illustrating a section of the substrate 4 provided with the first alignment mark 200 and the second alignment mark 201. As illustrated in FIG. 8, the substrate 4 includes a target layer 210 and a layer 211 different from the target layer 210. The layer that needs to be aligned upon forming a pattern on the substrate 4 is predetermined, and this is referred to as a target layer as described above. However, if another process (layer) has been formed on the target layer 210, the first alignment mark 200 provided in the target layer 210 may not be detected (observed) with a high contrast. On the other hand, since there is no shield (layer) that shields the second alignment mark 201, the second alignment mark 201 provided in the layer 211 different from the target layer 210 can be detected with a high contrast. Between the first alignment mark 200 and the second alignment mark 201, there is a positional shift (a shift from a design value) corresponding to the alignment error generated upon forming the second alignment mark 201. Accordingly, the second alignment mark 201 cannot be used intact as the measurement target in alignment measurement as a substitute (alternative) for the first alignment mark 200 provided in the target layer 210.

Therefore, in this embodiment, the relative position between the first alignment mark 200 and the second alignment mark 201 (that is, the alignment error between the two layers) is measured and grasped. With this, it is possible to calculate the position of the first alignment mark 200 from the position of the second alignment mark 201, so that alignment can be performed on the target layer 210 using the second alignment mark 201. The relative position between the first alignment mark 200 and the second alignment mark 201 is measured by the measurement apparatus 100.

Figure 9:
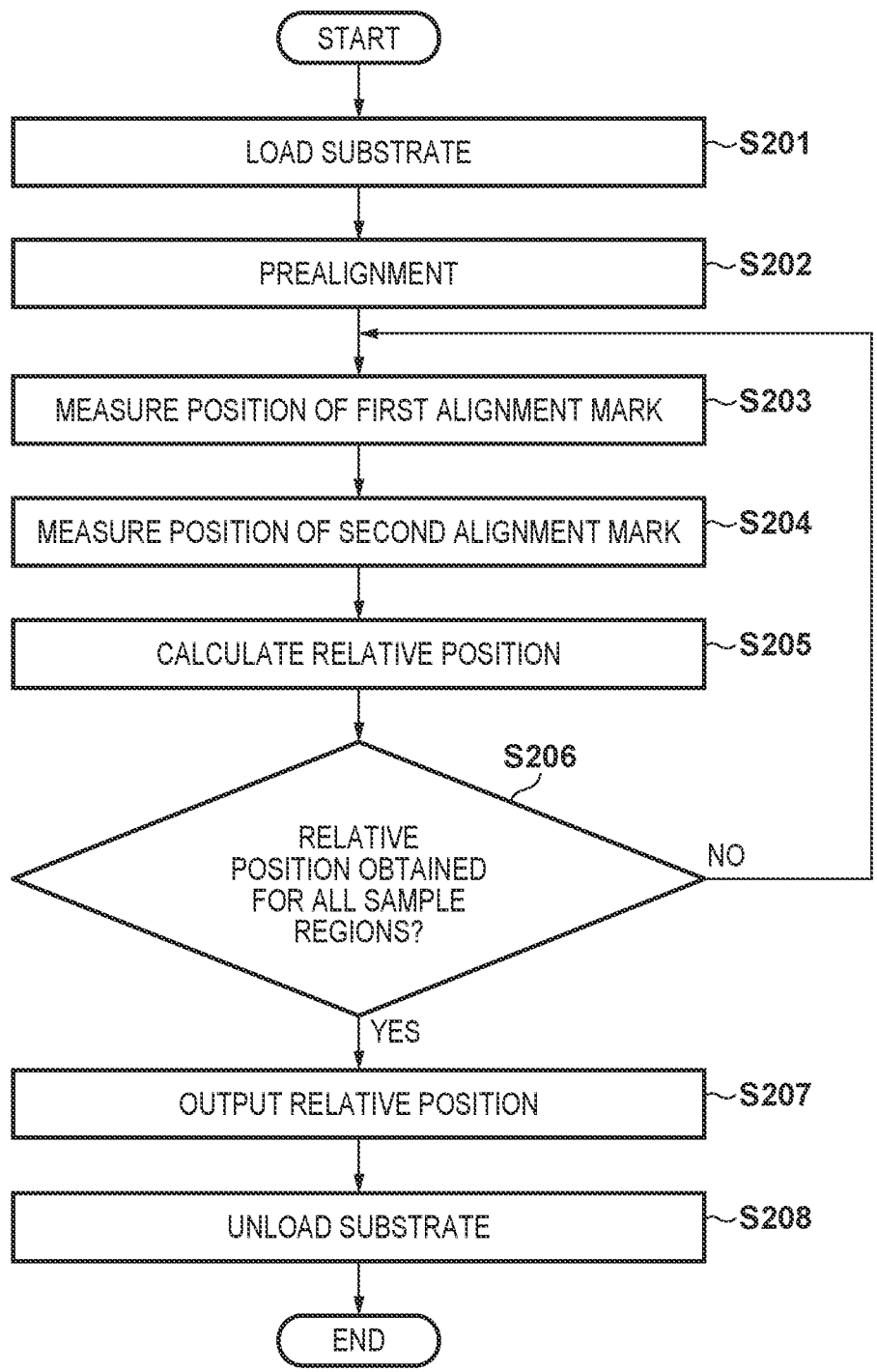
FIG. 9 is a flowchart for explaining a measurement process in the measurement apparatus.

With reference to FIG. 9, a measurement process in the measurement apparatus 100, more specifically, a measurement process of measuring the relative position between the first alignment mark 200 and the second alignment mark 201 will be described.

In step S201, the substrate 4 is loaded into the measurement apparatus 100.

In step S202, prealignment is performed. More specifically, the alignment mark 11 for prealignment provided on the substrate 4 is detected by the detection optical system 107 to obtain the position of the substrate 4 with low accuracy. At this time, detection of the alignment mark 11 is performed for the plurality of section regions of the substrate 4, and the shift and first-order linear components (magnification and rotation) of the entire substrate 4 are obtained.

In step S203, the position of the first alignment mark 200 provided in the target layer 210 in the sample region of the substrate 4 is measured. More specifically, based on the result of the prealignment, the substrate stage 106 is driven to a position where the detection optical system 107 can detect the first alignment mark 200. Then, the detection optical system 107 is used to detect the first alignment mark 200 provided in the target layer 210 in the sample region of the substrate 4 and measure the position of the first alignment mark 200.

In step S204, the position of the second alignment mark 201 provided in the layer 211 different from the target layer 210 in the sample region of the substrate 4 is measured. More specifically, based on the result of the prealignment, the substrate stage 106 is driven to a position where the detection optical system 107 can detect the second alignment mark 201. Then, the detection optical system 107 is used to detect the second alignment mark 201 provided in the layer 211 in the sample region of the substrate 4 and measure the position of the second alignment mark 201.

In step S205, based on the position of the first alignment mark 200 measured in step S203 and the position of the second alignment mark 201 measured in step S204, the relative position between the first alignment mark 200 and the second alignment mark 201 is calculated. For example, let (Ax, Ay) be the position of the first alignment mark 200 measured by the detection optical system 107 and (Bx, By) be the position of the second alignment mark 201 measured by the detection optical system 107. In this case, the relative position (Cx, Cy) between the first alignment mark 200 and the second alignment mark 201 is calculated by Cx=Bx−Ax and Cy=By−Ay. Calculation of the relative position between the first alignment mark 200 and the second alignment mark 201 may be performed by the control unit 108, or may be performed by the detection optical system 107 (an arithmetic unit thereof, which includes a CPU and the like). In this manner, the detection optical system 107 functions, in cooperation with the control unit 108 or solely, as the first measurement unit that detects the first alignment mark 200 and the second alignment mark 201 and measures the relative position between the alignment marks 200 and 201.

In step S206, it is determined whether the relative position between the first alignment mark 200 and the second alignment mark 201 has been obtained for all the sample regions of the substrate 4. If the relative position between the first alignment mark 200 and the second alignment mark 201 has not been obtained for all the sample regions of the substrate 4, the process returns to step S203 to obtain the relative position in the next sample region. On the other hand, if the relative position between the first alignment mark 200 and the second alignment mark 201 has been obtained for all the sample regions of the substrate 4, the process advances to step S207.

In step S207, the relative position between the first alignment mark 200 and the second alignment mark 201 obtained in step S205 is output to the exposure apparatus 1000. At this time, the control unit 108 functions as an output unit that outputs the relative position between the first alignment mark 200 and the second alignment mark 201 to the exposure apparatus 1000. Note that in this embodiment, the relative position between the first alignment mark 200 and the second alignment mark 201 is directly output from the measurement apparatus 100 to the exposure apparatus 1000, but the present invention is not limited to this. For example, the relative position between the first alignment mark 200 and the second alignment mark 201 may be output from the measurement apparatus 100 to the exposure apparatus 1000 via a host apparatus that performs communication between the measurement apparatus 100 and the exposure apparatus 1000.

In step S208, the substrate 4 is unloaded from the measurement apparatus 100.

Figure 10:
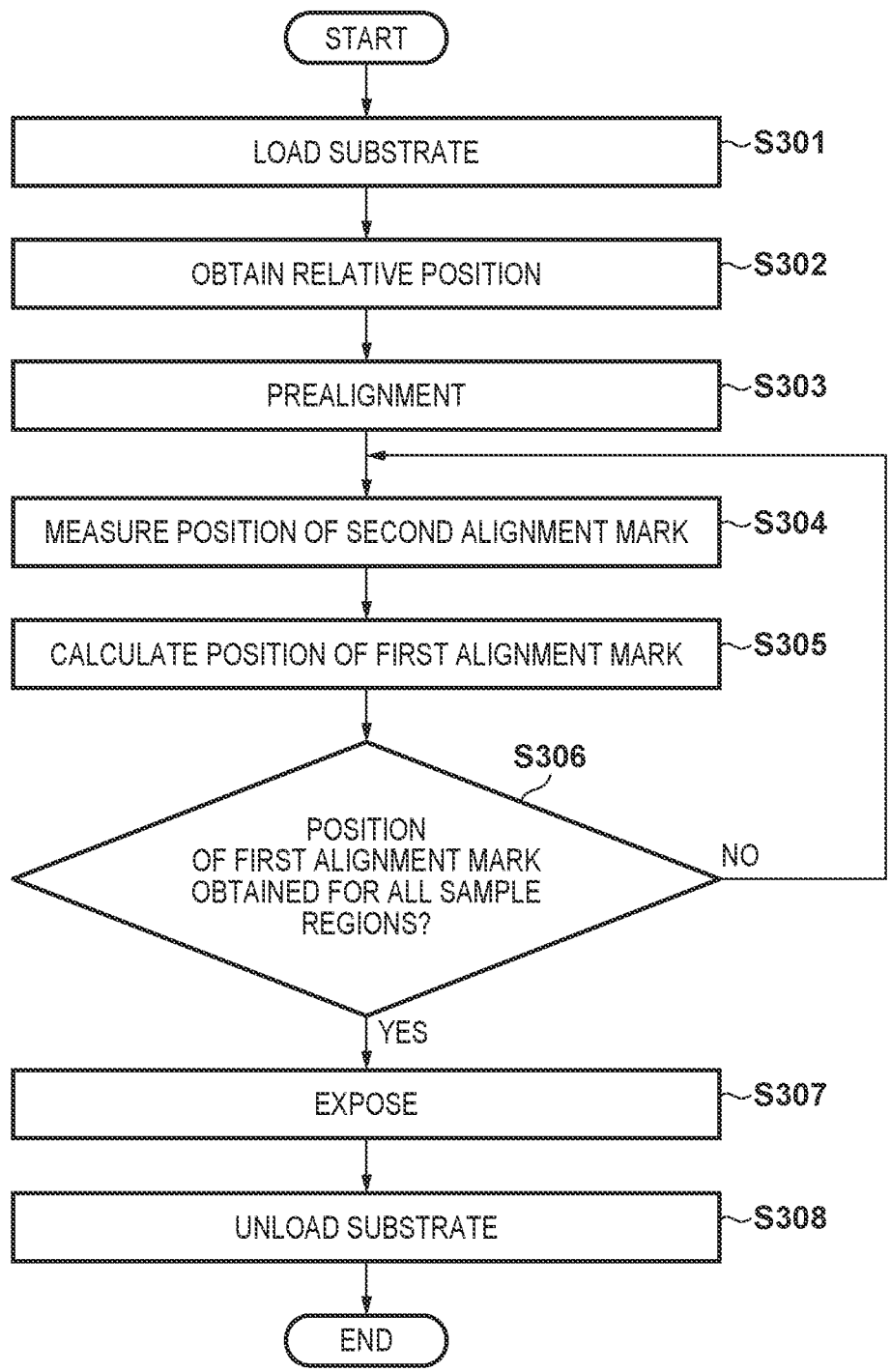
FIG. 10 is a flowchart for explaining processing of the substrate in the exposure apparatus.

With reference to FIG. 10, processing of the substrate 4 in the exposure apparatus 1000 will be described. More specifically, processing of aligning the substrate 4 to a target position and exposing the substrate 4 using the relative position between the first alignment mark 200 and the second alignment mark 201 obtained by the measurement apparatus 100 will be described.

In step S301, the substrate 4 is loaded into the exposure apparatus 1000.

In step S302, the relative position between the first alignment mark 200 and the second alignment mark 201 output from the measurement apparatus 100 is obtained. In other words, the relative position between the first alignment mark 200 and the second alignment mark 201 measured by the measurement apparatus 100 is obtained from the measurement apparatus 100.

In step S303, prealignment is performed. The prealignment is similar to the prealignment in step S102 illustrated in FIG. 4, and a detailed description thereof will be omitted here.

In step S304, the position of the second alignment mark 201 provided in the layer 211 different from the target layer 210 in the sample region of the substrate 4 is measured. More specifically, based on the result of the prealignment, the substrate stage 6 is driven to a position where the detection optical system 7 can detect the second alignment mark 201. Then, the detection optical system 7 is used to detect the second alignment mark 201 provided in the layer 211 in the sample region of the substrate 4 and measure the position of the second alignment mark 201. In this manner, the detection optical system 7 functions as the second measurement unit that detects the second alignment mark 201 and measures the position of the second alignment mark 201.

In step S305, the position of the first alignment mark 200 provided in the target layer 210 in the sample region of the substrate 4 is calculated. More specifically, the position of the first alignment mark 200 is calculated based on the relative position between the first alignment mark 200 and the second alignment mark 201 obtained in step S302 and the position of the second alignment mark 201 measured in step S304. For example, let (Bx', By') be the position of the second alignment mark 201 measured by the detection optical system 7. In this case, the position (Ax', Ay') of the first alignment mark 200 is calculated by Ax'=Bx'−Cx=Bx'−(Bx−Ax) and Ay'=By'−Cy=By'−(By−Ay). Note that calculation of the position of the first alignment mark 200 is performed by the control unit CU.

In step S306, it is determined whether the position of the first alignment mark 200 has been obtained for all the sample regions of the substrate 4. If the position of the first alignment mark 200 has not been obtained for all the sample regions of the substrate 4, the process returns to step S304 to obtain the position of the first alignment mark 200 in the next sample region. On the other hand, if the position of the first alignment mark 200 has been obtained for all the sample regions of the substrate 4, the process advances to step S307.

In step S307, the substrate 4 is exposed. More specifically, the substrate 4 is aligned to a target position based on the position of the first alignment mark 200 provided in the target layer 210 in the sample region of the substrate 4 calculated in step S305. Then, the pattern of the original 2 is transferred to each section region of the substrate 4 via the projection optical system 3.

In step S308, the substrate 4 is unloaded from the exposure apparatus 1000.

Thus, in this embodiment, instead of the first alignment mark 200 which the detection optical system 7 of the exposure apparatus 1000 cannot detect with high accuracy, the position of the second alignment mark 201 provided in the layer 211 different from the target layer 210 is measured. Then, the position of the first alignment mark 200 is obtained from the relative position between the first alignment mark 200 and the second alignment mark 201 measured by the measurement apparatus 100 and the position of the second alignment mark 201. With this, it is possible to align the substrate 4 to the target position and expose the substrate 4 while using, as a reference, the position of the first alignment mark 200 provided in the target layer 210.

Note that in this embodiment, a case has been described in which the position of the first alignment mark 200 is calculated, but the position of the first alignment mark 200 is not necessarily calculated. It is also possible to align the substrate 4 to the target position and expose the substrate 4 based on the relative position between the first alignment mark 200 and the second alignment mark 201 and the position of the second alignment mark 201 measured by the detection optical system 7. More specifically, the target position may be directly obtained by offsetting the relative position between the first alignment mark 200 and the second alignment mark 201 to the position of the second alignment mark 201. For example, let (Bx', By') be the position of the second alignment mark 201 measured by the detection optical system 7. In this case, the target position (Dx, Dy) can be obtained by Dx=Bx'−Cx and Dy=By'−Cy.

Further, between the substrate chuck 105 of the measurement apparatus 100 and the substrate chuck 5 of the exposure apparatus 1000, there may be a certain tendency for a distortion of the substrate 4 that occurs when the substrate 4 is held. In such a case, the offset caused by the distortion upon holding the substrate 4 may be corrected by reflecting a certain offset to the measurement value for each section region of the substrate 4. In other words, in this embodiment, matching correction between the measurement apparatus 100 and the exposure apparatus 1000 can be used together.

Alternatively, the process of calculating the mark position in each section region of the substrate 4 may be changed so as to calculate, for example, the statistical alignment correction values (the shift and first-order linear components of the entire substrate 4) for each mark, and the relative difference between the alignment correction values may be used. Note that the arrangement and the number of the sample regions to be measured by the measurement apparatus 100 may be different from those of the sample regions to be measured by the exposure apparatus 1000. In such a case, by using the statistical alignment correction value, conversion to the correction value for the target layer can be performed using the alignment correction value as a reference.

In the measurement apparatus 100, it is also possible to use a technique for measuring, with high accuracy, the position of the alignment mark 200 provided in the target layer 210. The technique includes, for example, a super-resolution technique that obtains a plurality of alignment mark images by slightly stepping the substrate stage 106 in the X direction and the Y direction for each sub-pixel of the alignment mark image and generates a pseudo-high-accuracy alignment mark image. In addition, the technique includes a technique that obtains a plurality of alignment mark images by stepping the substrate stage 106 in the Z direction and averages the measurement values of the alignment mark obtained from the respective alignment mark images, thereby reducing the influence of an aberration of the detection optical system 107. Further, the technique includes a technique that integrates a plurality of alignment mark images, thereby averaging the noise components generated when the respective alignment mark images are obtained.

Second Embodiment

In this embodiment, a case will be described in which the relative position between an alignment mark and an overlay inspection mark is measured and a substrate is aligned and exposed using the relative position. More specifically, a high-accuracy detection optical system 107 included in a measurement apparatus 100 is used to measure the relative position between an alignment mark and an overlay inspection mark provided on a substrate 4. With this, in an exposure apparatus 1000, it is possible to perform alignment using the overlay inspection mark as a reference (target) without measuring the position of the overlay inspection mark provided on the substrate 4.

Figure 11:
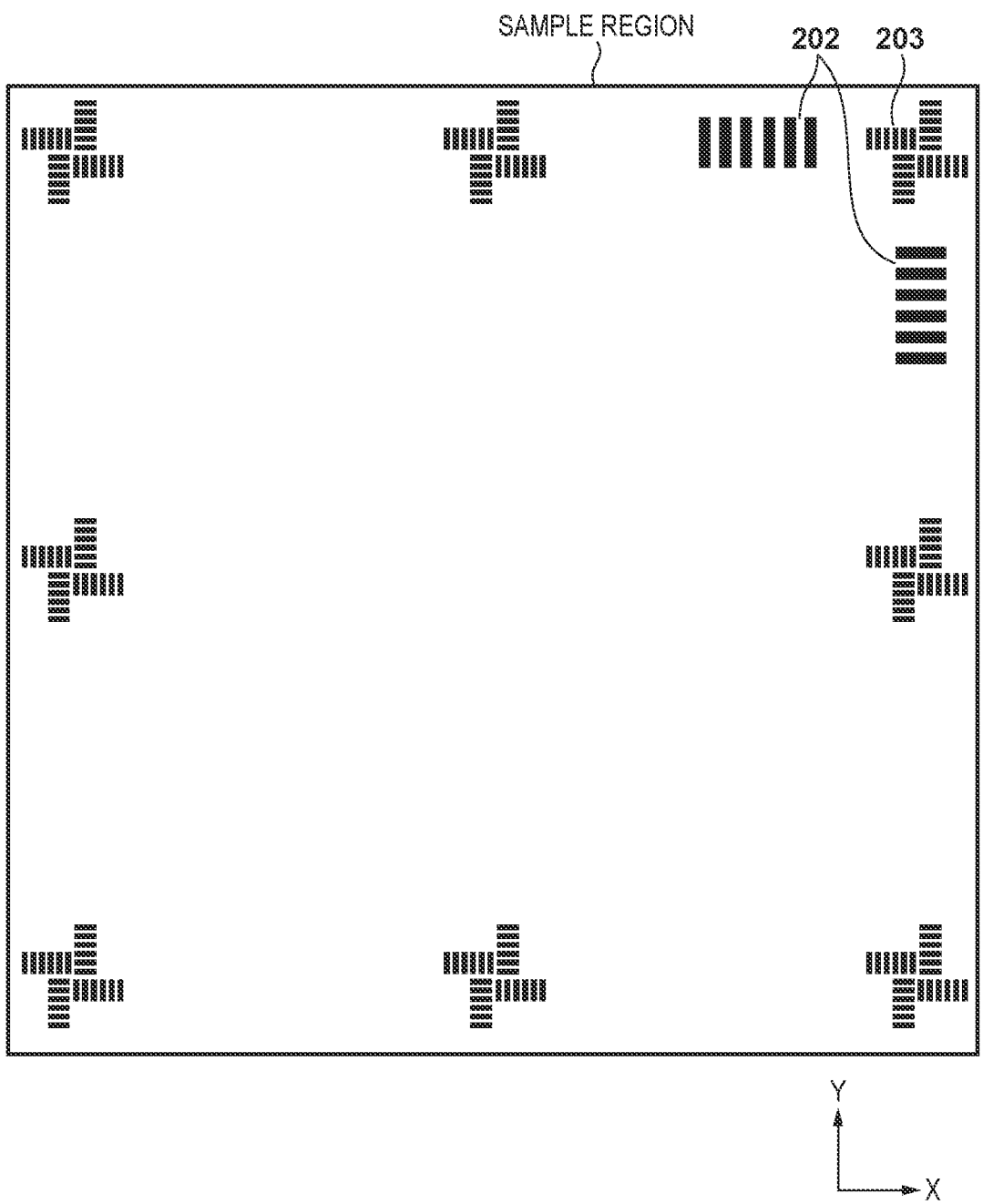
FIG. 11 is a view illustrating an example of overlay inspection marks and alignment marks provided in a sample region.

Configurations of a processing system 1 (the measurement apparatus 100 and the exposure apparatus 1000) in this embodiment are similar to those in the first embodiment, but configurations of marks provided on the substrate 4 are different from those in the first embodiment. As illustrated in FIG. 11, overlay inspection marks 203 (first structures) and an alignment mark 202 (second structure) are provided in a sample region of the substrate 4.

The alignment mark 202 is a type of mark for individually measuring the X direction and the Y direction, and can be detected by a detection optical system 7 of the exposure apparatus 1000. The alignment mark 202 is provided mainly for the purpose of measuring the position of the sample region (section region). Therefore, a plurality of the alignment marks 202 are rarely provided in the sample region.

Figure 12:
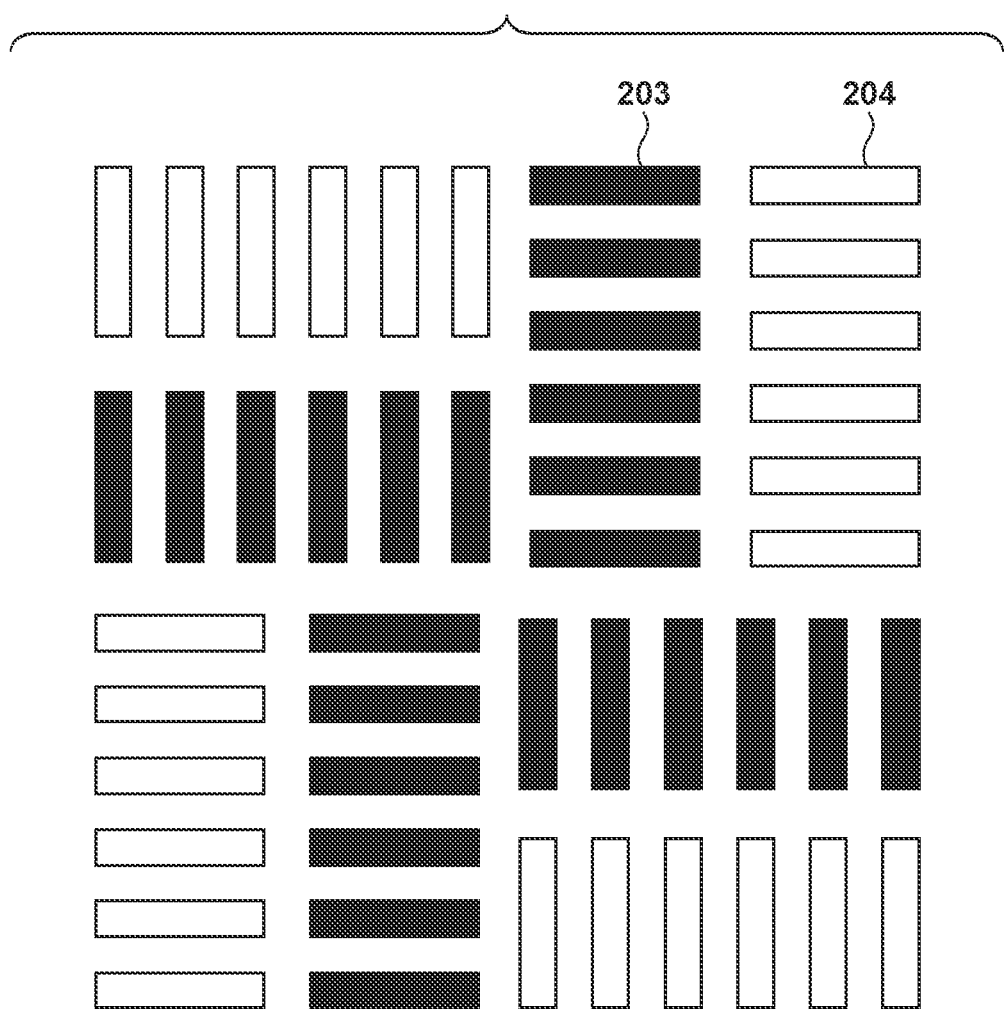
FIG. 12 is a view for explaining the overlay inspection marks.

The overlay inspection mark 203 is a type of mark for simultaneously measuring the X direction and the Y direction. The overlay inspection mark 203 cannot be detected by the detection optical system 7 of the exposure apparatus 1000. The overlay inspection mark 203 can be detected only by a detection optical system, like the detection optical system 107 of the measurement apparatus 100, that can capture the mark to obtain an image. As illustrated in FIG. 12, the overlay inspection mark 203 is used together with an overlay inspection mark 204 in the layer which corresponds to the target layer provided with the overlay inspection mark 203 having undergone exposure. The overlay inspection marks 203 and 204 are marks used to measure the relative position between the overlay inspection mark 203 and the overlay inspection mark 204 and inspect the positional shift (overly) between the layers. In overlay inspection, the shape of the sample region (section region) is also an inspection target. Therefore, a plurality of the overlay inspection marks 203 (or 204) are often provided in the sample region. Accordingly, by performing alignment using the overlay inspection marks 203, the shape of the section region of the substrate 4 can be corrected. Note that in the stage of performing measurement by the measurement apparatus 100 and the stage of performing alignment by the exposure apparatus 1000, the overlay inspection mark 204 has not been formed. Hence, in this embodiment, the overlay inspection mark 203 alone is used for alignment.

Figure 13:
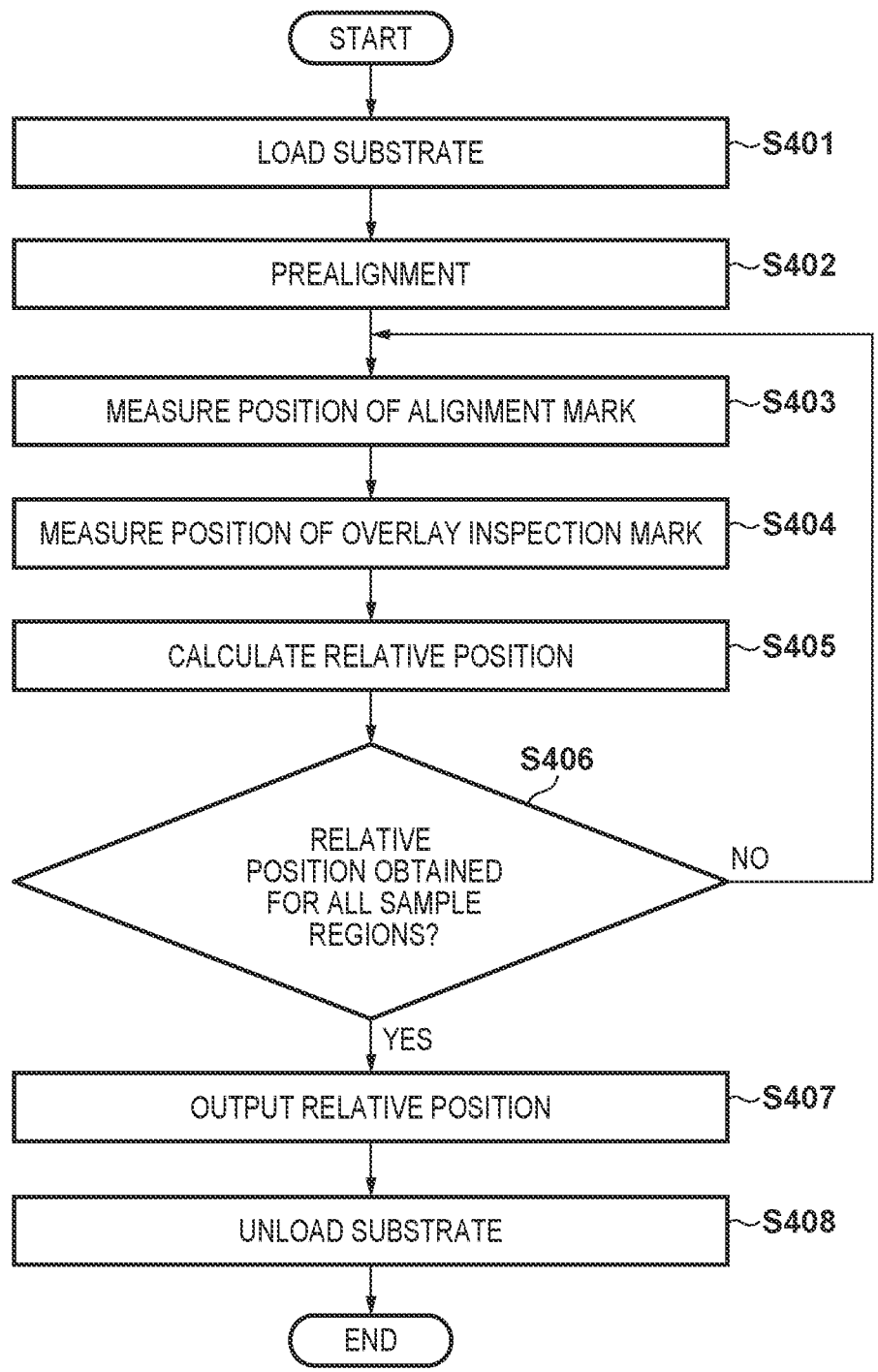
FIG. 13 is a flowchart for explaining a measurement process in a measurement apparatus.

With reference to FIG. 13, a measurement process in the measurement apparatus 100, more specifically, a measurement process of measuring the relative position between the alignment mark 202 and the overlay inspection mark 203 will be described. Note that steps S401, S402, S406, S407, and S408 illustrated in FIG. 13 are similar to steps S201, S202, S206, S207, and S208 described with reference to FIG. 9, respectively, and a detailed description thereof will be omitted here.

In step S403, the position of the alignment mark 202 provided in the sample region of the substrate 4 is measured. More specifically, based on the result of the prealignment, a substrate stage 106 is driven to a position where the detection optical system 107 can detect the alignment mark 202. Then, the detection optical system 107 is used to detect the alignment mark 202 provided in the sample region of the substrate 4 and measure the position of the alignment mark 202.

In step S404, the position of the overlay inspection mark 203 provided in the sample region of the substrate 4 is measured. More specifically, based on the result of the prealignment, the substrate stage 106 is driven to a position where the detection optical system 107 can detect each of the overlay inspection marks 203. Then, the detection optical system 107 is used to detect each of the overlay inspection marks 203 provided in the sample region of the substrate 4 and measure the position of each of the overlay inspection marks 203.

In step S405, based on the position of the alignment mark 202 measured in step S403 and the position of each of the overlay inspection marks 203 measured in step S404, the relative position between the alignment mark 202 and each of the overlay inspection marks 203 is calculated. Calculation of the relative position between the alignment mark 202 and each of the overlay inspection marks 203 may be performed by a control unit 108, or may be performed by the detection optical system 107 (an arithmetic unit thereof, which includes a CPU and the like).

Figure 14:
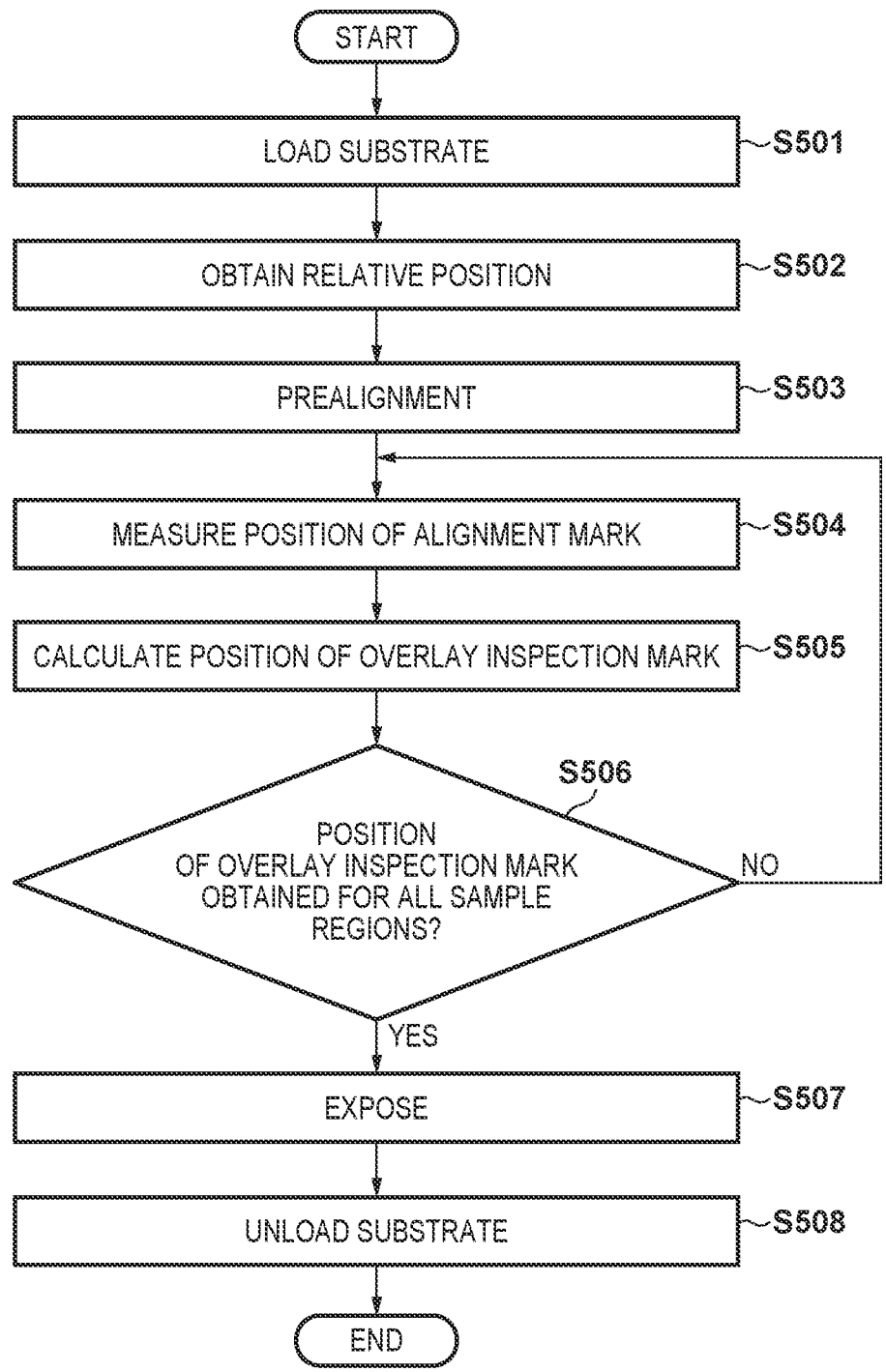
FIG. 14 is a flowchart for explaining processing of a substrate in an exposure apparatus.

With reference to FIG. 14, processing of the substrate 4 in the exposure apparatus 1000 will be described. More specifically, processing of aligning the substrate 4 to a target position and exposing the substrate 4 using the relative position between the alignment mark 202 and the overlay inspection mark 203 obtained by the measurement apparatus 100 will be described. Note that steps S501, S502, S503, S506, S507, and S508 illustrated in FIG. 14 are similar to steps S301, S302, S303, S306, S307, and S308 described with reference to FIG. 10, respectively, and a detailed description thereof will be omitted here.

In step S504, the position of the alignment mark 202 provided in the sample region of the substrate 4 is measured. More specifically, based on the result of the prealignment, a substrate stage 6 is driven to a position where the detection optical system 7 can detect the alignment mark 202. Then, the detection optical system 7 is used to detect the alignment mark 202 provided in the sample region of the substrate 4 and measure the position of the alignment mark 202.

In step S505, the position of the overlay inspection mark 203 provided in the sample region of the substrate 4 is calculated. More specifically, the position of each of the overlay inspection marks 203 is calculated based on the relative position between the alignment mark 202 and each of the overlay inspection marks 203 obtained in step S502 and the position of the alignment mark 202 measured in step S504. Note that calculation of the position of the overlay inspection mark 203 is performed by a control unit CU.

Thus, in this embodiment, instead of the overlay inspection mark 203 which the detection optical system 7 of the exposure apparatus 1000 cannot detect with high accuracy, the position of the alignment mark 202 is measured. Then, the position of the overlay inspection mark 203 is obtained from the relative position between the alignment mark 202 and the overlay inspection mark 203 measured by the measurement apparatus 100 and the position of the alignment mark 202. With this, in the exposure apparatus 1000, it is possible to align the substrate 4 to the target position and expose the substrate 4 while using, as a reference, the position of the overlay inspection mark 203 without measuring the position of the overlay inspection mark 203.

Third Embodiment

In this embodiment, a case will be described in which the relative position between an alignment mark and a device pattern is measured and a substrate is aligned and exposed using the relative position. More specifically, a high-accuracy detection optical system 107 included in a measurement apparatus 100 is used to measure the relative position between an alignment mark provided in a target layer of a substrate 4 and a device pattern provided in a layer different from the target layer. With this, in an exposure apparatus 1000, it is possible to perform alignment using the alignment mark as a reference (target) without measuring the position of the alignment mark provided in the target layer of the substrate 4.

Configurations of the measurement apparatus 100 in this embodiment are similar to those in the first embodiment, but configurations of the exposure apparatus 1000 and configurations of marks provided on the substrate 4 are different from those in the first embodiment.

Figure 15:
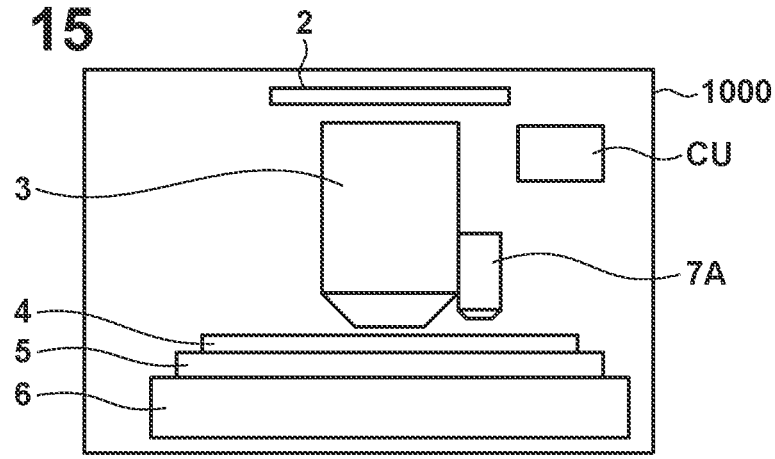
FIG. 15 is a schematic view illustrating configurations of an exposure apparatus.
Figure 16:
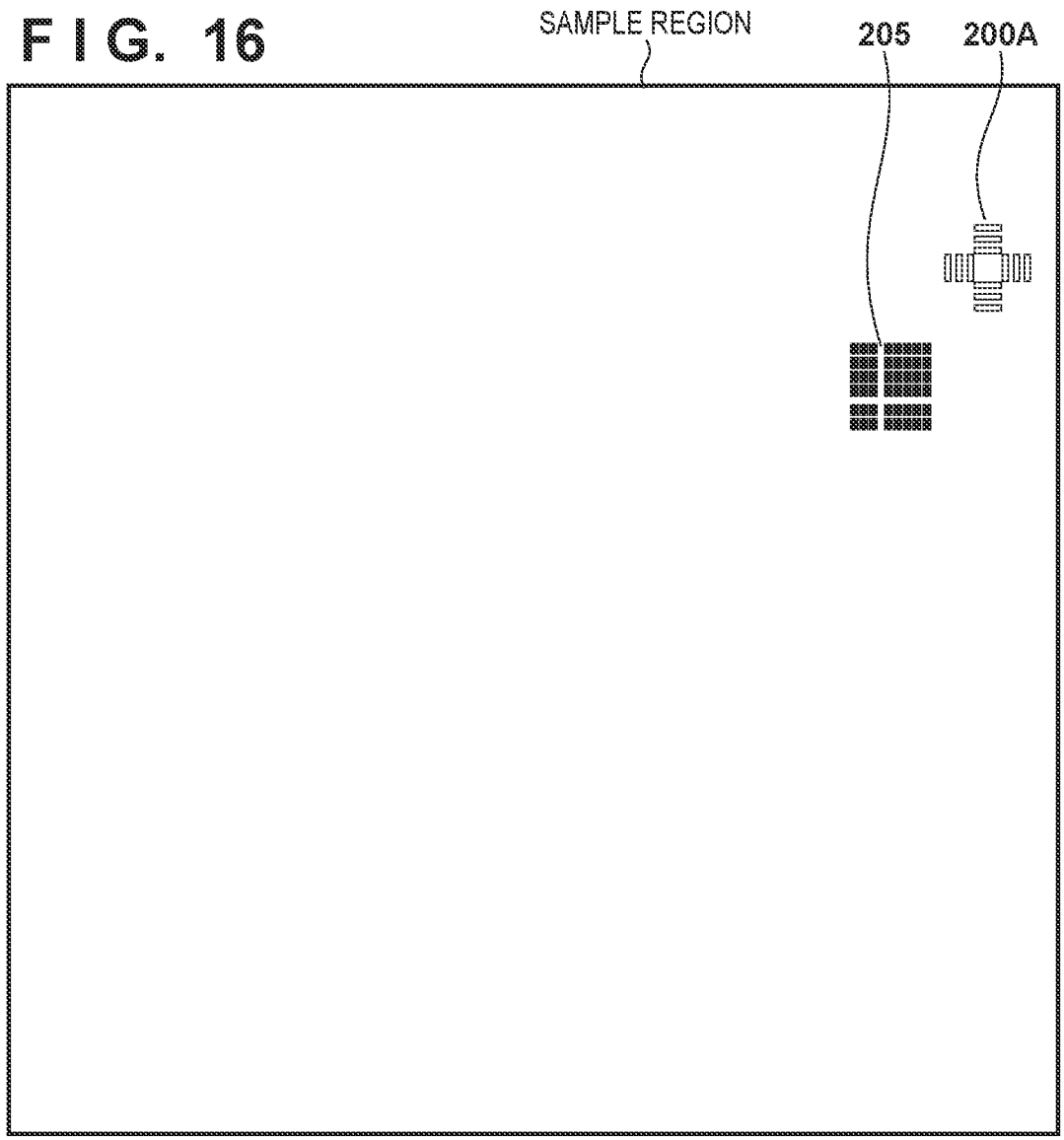
FIG. 16 is a view illustrating an example of an alignment mark and a device pattern provided in a sample region.

In this embodiment, the exposure apparatus 1000 includes a detection optical system 7A in place of the detection optical system 7 as illustrated in FIG. 15. The detection optical system 7A is a detection optical system that can capture a structure, which is the device pattern in this embodiment, provided in the substrate 4 and obtain an image including information regarding the position of the device pattern. As illustrated in FIG. 16, an alignment mark 200A (first structure) and a device pattern 205 (second structure)

are provided in a sample region of the substrate 4. The alignment mark 200A and the device pattern 205 are provided in different layers on the substrate 4. The alignment mark 200A is provided in the target layer on the substrate 4, and the device pattern 205 is provided in the layer different from the target layer on the substrate 4.

In this embodiment, not an alignment mark provided in the layer different from the target layer on the substrate 4 but the device pattern, which can be detected by the detection optical system 7A, provided in the layer different from the target layer is used as an alternative mark. If it is difficult to detect the alignment mark 200A provided in the target layer with a high contrast, a structure that can be detected with a high contrast may be only the device pattern provided in the layer different from the target layer. In such a case, this embodiment is useful. Note that when measuring the position of the device pattern having an arbitrary shape, shape information regarding the shape of the device pattern is obtained in advance and a technique such as template matching or phase correlation using the shape information as a reference may be used.

Descriptions of a measurement process in the measurement apparatus 100 and processing of the substrate 4 in the exposure apparatus 1000 can be obtained simply by replacing the second alignment mark 201 described in the first embodiment (FIGS. 9 and 10) with the device pattern 205, so that a detail description thereof will be omitted here.

Thus, in this embodiment, in place of the alignment mark 200A which the detection optical system 7A of the exposure apparatus 1000 cannot detect with high accuracy, the position of the device pattern 205 provided in the layer different from the target layer is measured. Then, the position of the alignment mark 200A is obtained from the relative position between the alignment mark 200A and the device pattern 205 measured by the measurement apparatus 100 and the position of the device pattern 205. With this, in the exposure apparatus 1000, it is possible to align the substrate 4 to the target position and expose the substrate 4 while using, as a reference, the position of the alignment mark 200A without measuring the position of the alignment mark 200A provided in the target layer.

Fourth Embodiment

In this embodiment, a high-accuracy detection optical system 107 included in a measurement apparatus 100 is used to, when detecting a device pattern provided in a layer different from a target layer on a substrate, search (select) for a device pattern that can be detected with a high contrast.

Figure 17:
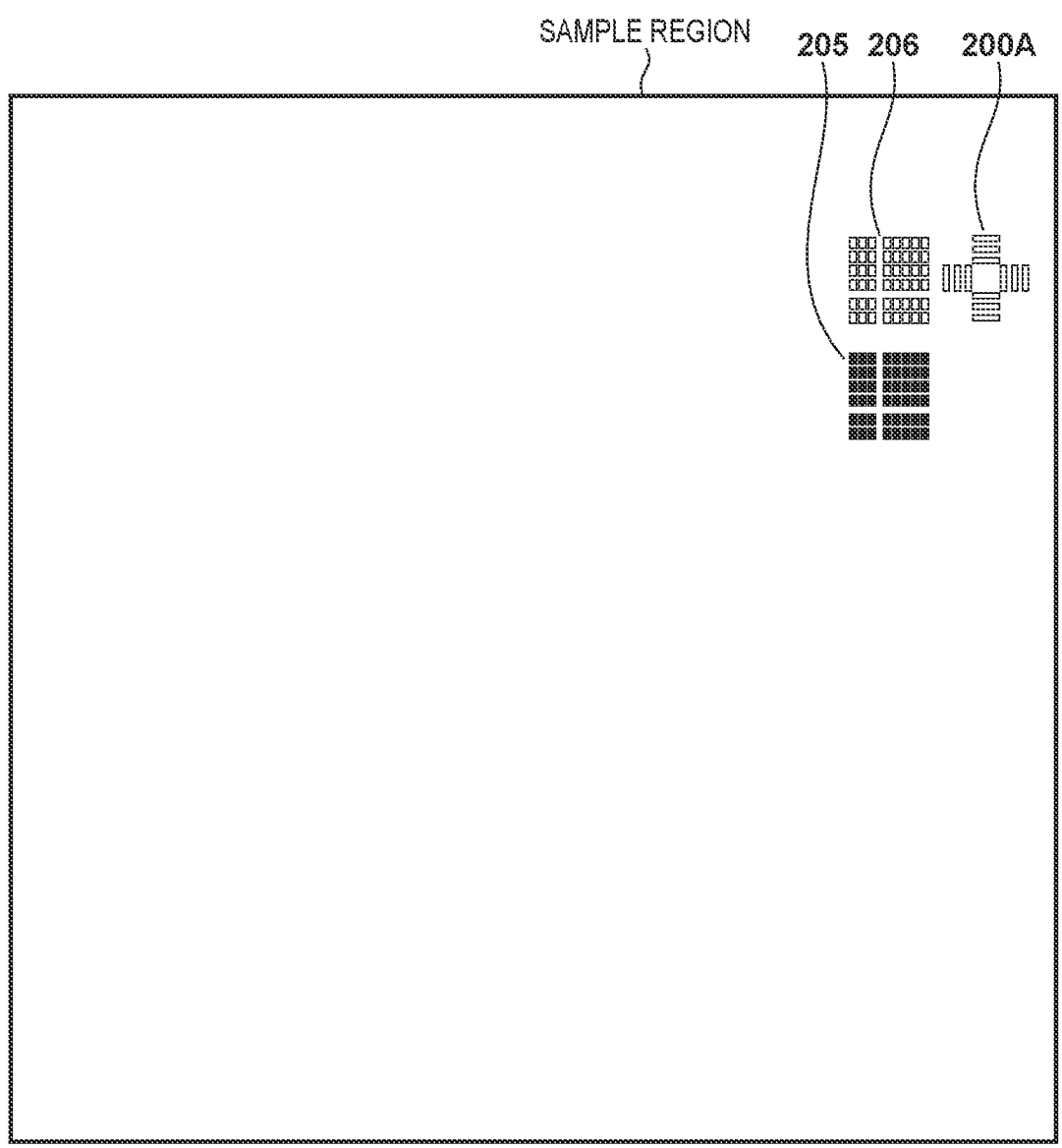
FIG. 17 is a view illustrating an example of an alignment mark and a plurality of device patterns provided in a sample region.

Configurations of a processing system 1 (the measurement apparatus 100 and an exposure apparatus 1000) in this embodiment are similar to those in the third embodiment, but configurations of marks provided on a substrate 4 are different from those in the third embodiment. As illustrated in FIG. 17, an alignment mark 200A (first structure) and a plurality of device patterns 205 and 206 (second structures) as candidates for an alternative mark are provided in a sample region of the substrate 4. The alignment mark 200A and the plurality of device patterns 205 and 206 are provided in different layers on the substrate 4. The alignment mark 200A is provided in a target layer on the substrate 4. The plurality of device patterns 205 and 206 can be detected by a detection optical system 7A, and provided in a layer different from the target layer on the substrate 4. In this embodiment, the device pattern to be measured by the detection optical system 7A is selected while comparing the contrasts in portions corresponding to the plurality of device patterns 205 and 206, respectively, included in an image obtained by the detection optical system 107.

Figure 18:
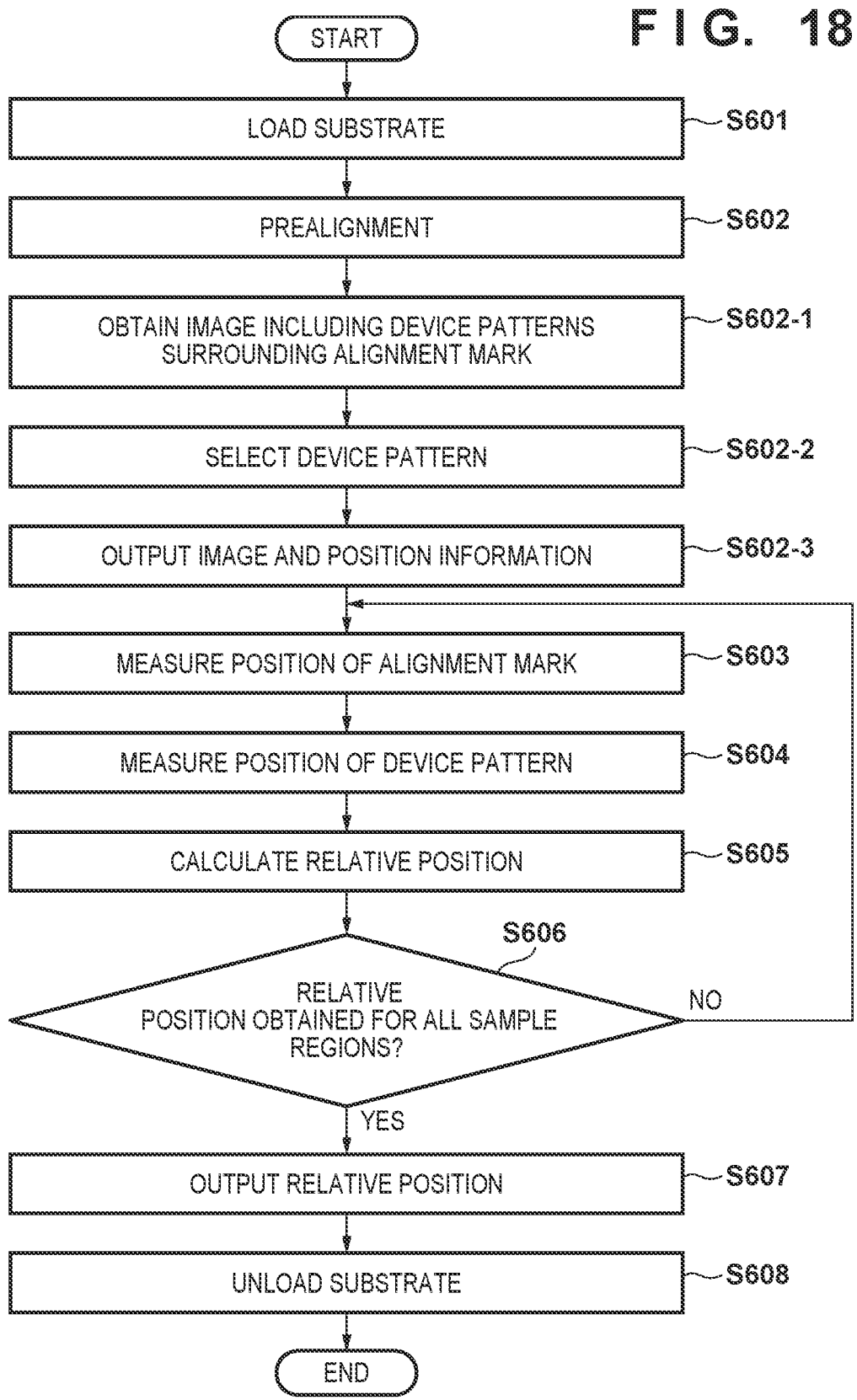
FIG. 18 is a flowchart for explaining a measurement process in a measurement apparatus.

With reference to FIG. 18, a measurement process in the measurement apparatus 100, more specifically, a measurement process of measuring the relative position between the alignment mark 200A and the device pattern 205 or 206 will be described. Note that steps S601, S602, and S606 to S608 illustrated in FIG. 18 are similar to steps S201, S202, and S206 to S208 described with reference to FIG. 9, respectively, and a detailed description thereof will be omitted here. Note that, for steps S603 and S604, the first alignment mark 200 and the second alignment mark 201 described in the first embodiment (FIG. 9) are replaced with the alignment mark 200A and the device pattern 205 or 206, respectively.

In step S602-1, the device patterns 205 and 206, which exist around the alignment mark 200A provided in the target layer of the substrate 4, are captured to obtain an image including the device patterns 205 and 206.

In step S602-2, based on the image obtained in step S602-1, the device pattern to be measured by the detection optical system 7A is selected from the plurality of device patterns 205 and 206. More specifically, the contrasts in the portions corresponding to the device patterns 205 and 206, respectively, included in the image obtained in step S602-1 are calculated and, based on the contrasts, the device pattern to be measured by the detection optical system 7A is selected. In this embodiment, the contrasts in the portions corresponding to the device patterns 205 and 206 respectively are compared, and the device pattern 205 corresponding to the portion having the highest contrast is selected as the device pattern to be measured by the detection optical system 7A. Such calculation of the contrasts and selection of the device pattern corresponding to the portion having the highest contrast are performed by, for example, a control unit 108 (the control unit 108 functions as a selection unit that selects the device pattern to be measured by the detection optical system 7A).

In step S602-3, the image obtained in step 602-1 and position information indicating the position of the device pattern 205 selected in step S602-2 are output to the exposure apparatus 1000. The image obtained in step 602-1 and the position of the device pattern 205 selected in step S602-2 serve as a reference image and a reference position, respectively, upon measuring the position of the device pattern 205 in the exposure apparatus 1000. Such output of the image and the position information is performed by, for example, the control unit 108 (the control unit 108 functions as an output unit that outputs the image and the position information).

Figure 19:
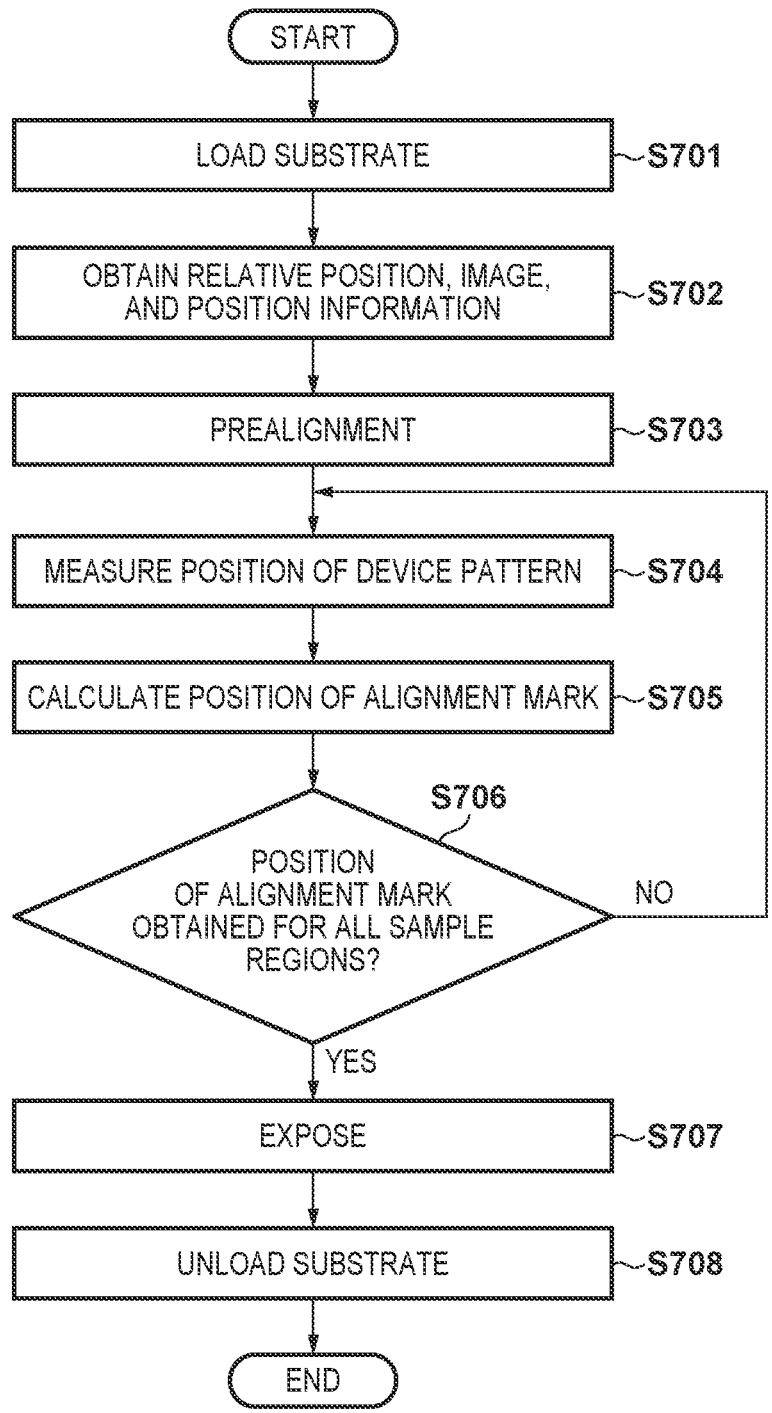
FIG. 19 is a flowchart for explaining processing of a substrate in an exposure apparatus.

With reference to FIG. 19, processing of the substrate 4 in the exposure apparatus 1000 will be described. More specifically, processing of aligning the substrate 4 to a target position and exposing the substrate 4 using the relative position between the alignment mark 200A and the device pattern 205 obtained by the measurement apparatus 100 will be described. Note that steps S701, S703, and S706 to S708 illustrated in FIG. 19 are similar to steps S301, S303, S306 to S308 described with reference to FIG. 10, respectively, and a detailed description thereof will be omitted here.

In step S702, the relative position between the alignment mark 200A and the device pattern 205, the image including the device pattern 205, and the position information indicating the position of the device pattern 205 output from the measurement apparatus 100 are obtained. In this embodiment, in addition to the relative position between the alignment mark 200A and the device pattern 205, the image including the device pattern 205 and the position information indicating the position of the device pattern 205 are also obtained.

In step S704, based on the image including the device pattern 205 and the position information indicating the position of the device pattern 205 obtained in step S702, the position of the device pattern 205 provided in the layer different from the target layer in the sample region of the substrate 4 is measured. More specifically, in accordance with the position information obtained in step S702, the device pattern 205 selected in step S602-2 is captured. Then, based on the image including information regarding the position of the device pattern 205 and the image including the device pattern 205 obtained in step S702, the position of the device pattern 205 is obtained.

In step S705, the position of the alignment mark 200A provided in the target layer in the sample region of the substrate 4 is calculated. More specifically, based on the relative position between the alignment mark 200A and the device pattern 205 obtained in step S702 and the position of the device pattern 205 measured in step S704, the position of the alignment mark 200A is calculated.

Thus, in this embodiment, in place of the alignment mark 200A which the detection optical system 7A of the exposure apparatus 1000 cannot detect with high accuracy, the position of the device pattern 205 provided in the layer different from the target layer is measured. At this time, the device pattern 205, which can be detected by the detection optical system 7A with a high contrast, is automatically selected from the plurality of device patterns 205 and 206 and set as the device pattern to be measured by the detection optical system 7A. Then, the position of the alignment mark 200A is obtained from the relative position between the alignment mark 200A and the device pattern 205 measured by the measurement apparatus 100 and the position of the device pattern 205. With this, in the exposure apparatus 1000, it is possible to align the substrate 4 to the target position and expose the substrate 4 while using, as a reference, the position of the alignment mark 200A without measuring the position of the alignment mark 200A provided in the target layer. Note that the device pattern to be measured by the detection optical system 7A may be selected for each section region of the substrate 4.

Fifth Embodiment

In this embodiment, a difference in distortion (influence of the aberration) between a detection optical system 107 included in a measurement apparatus 100 and a detection optical system 7A included in an exposure apparatus 1000 is considered and corrected. Note that configurations of a processing system 1 (the measurement apparatus 100 and the exposure apparatus 1000) in this embodiment are similar to those in the fourth embodiment.

A measurement process in the measurement apparatus 100 and processing of a substrate 4 in the exposure apparatus 1000 are basically similar to those in the fourth embodiment (FIGS. 18 and 19). However, a correction amount for the distortion which occurs due to the aberration of the detection optical system 107 included in the measurement apparatus 100 and a correction amount for the distortion which occurs due to the aberration of the detection optical system 7A included in the exposure apparatus 1000 are obtained in advance. Then, in the measurement apparatus 100, in step S602-3, distortion correction is performed on the image obtained in step S602-1 to generate a correction image from which the influence of the distortion of the detection optical system 107 has been removed. On the other hand, in the exposure apparatus 1000, in step S704, the position of the device pattern 205 is obtained after performing distortion correction on the image obtained by capturing a device pattern 205 to remove the influence of the distortion of the detection optical system 7A.

Thus, in this embodiment, in the measurement apparatus 100, a correction image is generated by removing the influence of the aberration of the detection optical system 107 from the image obtained by the detection optical system 107 (a control unit 108 is caused to function as a generation unit). In the exposure apparatus 1000, the influence of the aberration of the detection optical system 7A is removed from the image obtained by the detection optical system 7A and, based on the image after the removal and the correction image, the position of the device pattern 205 is obtained. With this, it is possible to measure the position of the device pattern 205 while reducing the influence of the aberration of the detection optical system 7A.

Sixth Embodiment

This embodiment enables high-speed processing upon considering and correcting a difference in distortion (influence of the aberration) between a detection optical system 107 included in a measurement apparatus 100 and a detection optical system 7A included in an exposure apparatus 1000. Note that configurations of a processing system 1 (the measurement apparatus 100 and the exposure apparatus 1000) in this embodiment are similar to those in the fourth embodiment.

A measurement process in the measurement apparatus 100 and processing of a substrate 4 in the exposure apparatus 1000 are basically similar to those in the fourth embodiment (FIGS. 18 and 19). However, a correction amount for the distortion which occurs due to the aberration of the detection optical system 107 included in the measurement apparatus 100 and a correction amount for the distortion which occurs due to the aberration of the detection optical system 7A included in the exposure apparatus 1000 are obtained in advance. In this embodiment, in step S602-3, distortion correction of the detection optical system 107 is performed on the image obtained in step S602-1 and then reverse correction of the distortion of the detection optical system 7A is performed to generate a correction image. With this, in the exposure apparatus 1000, the image (correction image) including the distortion of the detection optical system 7A is used as a reference when measuring the position of a device pattern 205. Hence, it is unnecessary to perform distortion correction in the exposure apparatus 1000.

Thus, in this embodiment, in the measurement apparatus 100, the correction image is generated by removing the influence of the aberration of the detection optical system 107 from the image obtained by the detection optical system 107 and adding the influence of the aberration of the detection optical system 7A. Then, in the exposure apparatus 1000, based on the image obtained by the detection optical system 7A and the correction image, the position of the device pattern 205 is obtained. With this, it is possible to measure the position of the device pattern 205 while reducing the influence of the aberration of the detection optical system 7A. In addition, although the distortion correction usually takes time, by performing the distortion correction in the measurement apparatus 100, the influence on the throughput of the exposure apparatus 1000 is reduced so that high-speed processing in the exposure apparatus 1000 is implemented.

Seventh Embodiment

In this embodiment, a high-accuracy detection optical system 107 included in a measurement apparatus 100 is used to, when detecting a device pattern, search (select) for a device pattern that can be detected with a high contrast by a detection optical system 7A included in an exposure apparatus 1000. Note that configurations of a processing system 1 (the measurement apparatus 100 and the exposure apparatus 1000) in this embodiment are similar to those in the fourth embodiment.

A measurement process in the measurement apparatus 100 and processing of a substrate 4 in the exposure apparatus 1000 are basically similar to those in the fourth embodiment (FIGS. 18 and 19). However, in step S602-1, when capturing device patterns 205 and 206 to obtain an image, detection conditions of the detection optical system 107 included in the measurement apparatus 100 are changed (set) so as to match detection conditions of the detection optical system 7A included in the exposure apparatus 1000. For example, the wavelength of light for illuminating an alignment mark 200A and the device patterns 205 and 206 and the numerical aperture of the detection optical system 107 are set so as to match those of the detection optical system 7A. Note that the detection optical system 107 has configurations capable of changing settings of the detection conditions as described above.

Thus, in this embodiment, the detection optical system 107 detects the alignment mark 200A and the device patterns 205 and 206 under the same detection conditions as those under which the detection optical system 7A detects the device pattern 205 or 206. With this, it is possible to select, as the device pattern to be measured by the detection optical system 7A, the device pattern which the detection optical system 7A of the exposure apparatus 1000 can detect with the highest contrast.

Eighth Embodiment

In this embodiment, a case will be described in which the relative position between an alignment mark provided in a target layer below a non-transmissive layer and an alternative mark is measured and a substrate is aligned and exposed using the relative position. More specifically, a first measurement device having a special function and a high-accuracy second measurement device, both of which are included in a measurement apparatus 100, are used to measure the relative position between the alignment mark provided in the target layer below the non-transmissive layer and the alternative mark. With this, in an exposure apparatus 1000, it is possible to perform alignment using the alignment mark as a reference (target) without measuring the position of the alignment mark provided in the target layer of a substrate 4.

Figure 20:
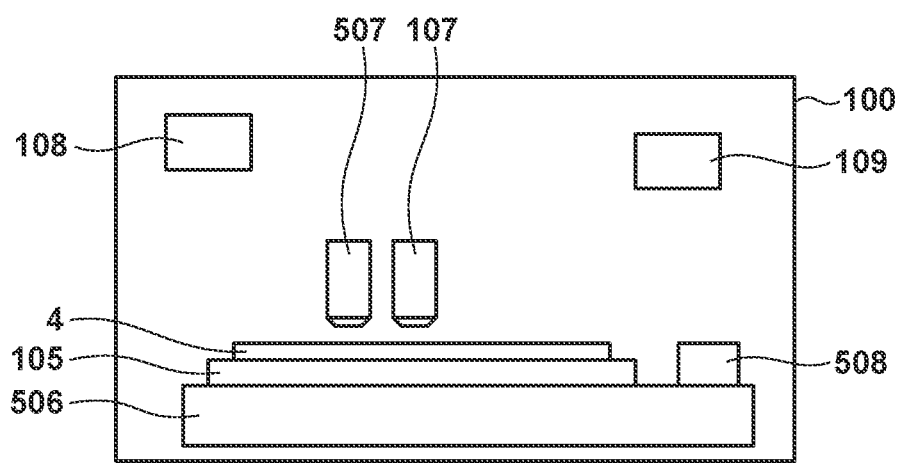
FIG. 20 is a schematic view illustrating configurations of a measurement apparatus.

Configurations of the exposure apparatus 1000 in this embodiment are similar to those in the first embodiment, but configurations of the measurement apparatus 100 are different from those in the first embodiment. FIG. 20 is a schematic view illustrating configurations of the measurement apparatus 100 in this embodiment. The measurement apparatus 100 includes, in addition to a substrate chuck 105, a substrate stage 506, a detection optical system 107, and a control unit 108, a special detection optical system 507 that has a special function. The special detection optical system 507 functions as the first measurement device that detects the first structure provided on the substrate 4 and measures the position of the first structure, and the detection optical system 107 functions as the second measurement device that detects the second structure provided on the substrate 4 and measures the position of the second structure. Note that the special function is, for example, a function for detecting, using infrared light, an X-ray, an ultrasonic wave, or the like, an alignment mark provided in a layer below a non-transmissive layer, which is difficult to detect using normal light. Further, a reference mark 508 used to manage the relative position between the detection optical system 107 and the special detection optical system 507 and perform calibration is arranged on the substrate stage 506.

Figure 21:
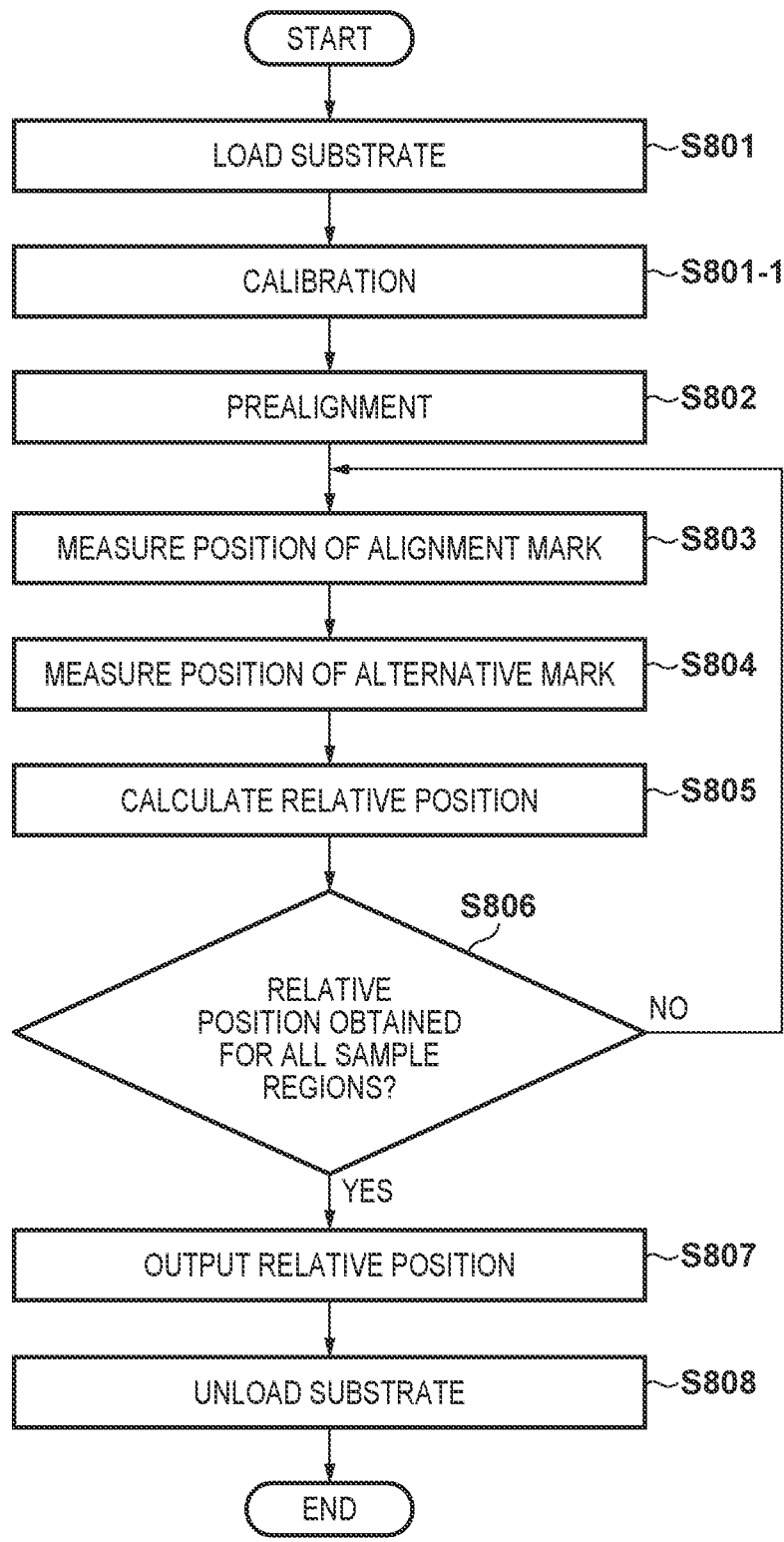
FIG. 21 is a flowchart for explaining a measurement process in a measurement apparatus.

With reference to FIG. 21, a measurement process in the measurement apparatus 100, more specifically, a measurement process of measuring the relative position between an alignment mark provided in a target layer of the substrate 4 and an alternative mark provided in a layer different from the target layer will be described.

In step S801, the substrate 4 is loaded into the measurement apparatus 100.

In step S801-1, calibration is performed. More specifically, each of the detection optical system 107 and the special detection optical system 507 detects the reference mark 508 arranged on the substrate stage 506 to manage the relative position of the detection optical system 107 and the special detection optical system 507.

In step S802, prealignment is performed. More specifically, an alignment mark 11 for prealignment provided on the substrate 4 is detected by the detection optical system 107 to obtain the position of the substrate 4 with low accuracy. At this time, detection of the alignment mark 11 is performed for a plurality of section regions of the substrate 4, and the shift and first-order linear components (magnification and rotation) of the entire substrate 4 are obtained.

In step S803, the position of the alignment mark provided in the target layer in the sample region of the substrate 4 is measured. More specifically, based on the result of the prealignment, the substrate stage 506 is driven to a position where the special detection optical system 507 can detect the alignment mark. Then, the special detection optical system 507 is used to detect the alignment mark provided in the target layer in the sample region of the substrate 4 and measure the position of the alignment mark.

In step S804, the position of the alternative mark provided in the layer different from the target layer in the sample region of the substrate 4 is measured. More specifically, based on the result of the prealignment, the substrate stage 506 is driven to a position where the detection optical system 107 can detect the alternative mark. Then, the detection optical system 107 is used to detect the alternative mark provided in the layer different from the target layer in the sample region of the substrate 4 and measure the position of the alternative mark.

In step S805, based on the position of the alignment mark measured in step S803 and the position of the alternative mark measured in step S804, the relative position between the alignment mark and the alternative mark is calculated. At this time, the relative position between the alignment mark and the alternative mark is calculated in consideration of the calibration performed in step S801-1.

In step S806, it is determined whether the relative position between the alignment mark and the alternative mark has been obtained for all the sample regions of the substrate 4. If the relative position between the alignment mark and the alternative mark has not been obtained for all the sample regions of the substrate 4, the process returns to step S803 to obtain the relative position in the next sample region. On the other hand, if the relative position between the alignment mark and the alternative mark has been obtained for all the sample regions of the substrate 4, the process advances to step S807.

In step S807, the relative position between the alignment mark and the alternative mark obtained in step S805 is output to the exposure apparatus 1000.

In step S808, the substrate 4 is unloaded from the measurement apparatus 100.

A description of processing of the substrate 4 in the exposure apparatus 1000 can be obtained simply by replacing the second alignment mark 201 described in the first embodiment (FIGS. 9 and 10) with the alternative mark, so that a detailed description thereof will be omitted here.

Thus, in this embodiment, in place of the alignment mark provided in the target layer below the non-transmissive layer, which a detection optical system 7 of the exposure apparatus 1000 cannot detect, the position of the alternative mark provided in the layer different from the target layer is measured. Then, the position of the alignment mark is obtained from the relative position between the alignment mark and the alternative mark measured by the measurement apparatus 100 and the position of the alternative mark. With this, in the exposure apparatus 1000, it is possible to align the substrate 4 to the target position and expose the substrate 4 while using, as a reference, the position of the alignment mark without measuring the position of the alignment mark provided in the target layer. Note that in this embodiment, the alternative mark is detected by the detection optical system 107 in the measurement apparatus 100, but the special detection optical system 507 may detect the alternative mark if the special detection optical system 507 can detect the alternative mark.

Ninth Embodiment

Figure 22:
FIG. 22 is a view illustrating an image including the unique texture of a substrate.

In this embodiment, if there is none of the alignment mark, the overlay inspection mark, the device pattern, and the like that can be detected as an alternative mark, the unique texture of a substrate 4 may be detected in place of the alternative mark. FIG. 22 is a view illustrating an image including the unique texture of the substrate 4. The unique texture of the substrate 4 includes, for example, a polishing mark, a grain boundary, an edge, or a notch of the substrate 4. Similar to the alignment mark and the device pattern, the position of the unique texture of the substrate 4 can be measured using a measurement method such as phase correlation.

Tenth Embodiment

An article manufacturing method according to an embodiment of the present invention is suitable for, for example, manufacturing an article such as a device (a semiconductor device, a magnetic storage medium, a liquid crystal display device, or the like). The manufacturing method includes a step of forming a pattern on a substrate using a processing system 1 (exposure apparatus 1000), a step of processing the substrate on which the pattern has been formed, and a step of manufacturing an article from the processed substrate. In addition, the manufacturing method can include other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-072074 filed on Apr. 21, 2021 which is hereby incorporated by reference herein in its entirety.

What is claimed is:

1. A measurement apparatus comprising:
   a first detection optical system configured to detect a first measurement target and a plurality of second measurement targets different from the first measurement target provided on a substrate;
   a selection unit configured to select a second measurement target, from the plurality of the second measurement targets, to be measured by a second detection optical system of a substrate processing apparatus that processes the substrate; and
   an output unit configured to output a relative position between the first measurement target and the selected second measurement target, the relative position being measured by the first detection optical system, to the substrate processing apparatus,
   wherein the first detection optical system detects the plurality of second measurement targets under a detection condition matching a detection condition of the second detection optical system, and
   wherein the detection condition includes wavelength of light for illuminating the plurality of second measurement targets or numerical aperture of the first detection optical system.

2. The apparatus according to claim 1, wherein letting L be a relative distance between the first measurement target and the second measurement target and S be a size of the second structure,
   $L/S > 3$ is satisfied.

3. The apparatus according to claim 1, wherein the selection unit selects, based on contrasts in portions corresponding to the plurality of the second measurement targets, respectively, included in an image obtained by the first detection optical system, the second measurement target.

4. The apparatus according to claim 1, further comprising an interface used by a user to designate the first measurement target and the second measurement target to be detected by the measurement unit.

* * * * *